US009857477B2

(12) United States Patent
Yoon et al.

(10) Patent No.: US 9,857,477 B2
(45) Date of Patent: Jan. 2, 2018

(54) METHOD FOR GENERATING UNAMBIGUOUS CORRELATION FUNCTION FOR CBOC (6,1,1/11) SIGNAL BASED ON PARTIAL CORRELATION FUNCTIONS, APPARATUS FOR TRACKING CBOC SIGNALS AND SATELLITE NAVIGATION SIGNAL RECEIVER SYSTEM

(71) Applicant: Research & Business Foundation SUNGKYUNKWAN UNIVERSITY, Suwon-si (KR)

(72) Inventors: Seok Ho Yoon, Suwon-si (KR); Keun Hong Chae, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 682 days.

(21) Appl. No.: 14/534,289

(22) Filed: Nov. 6, 2014

(65) Prior Publication Data
US 2015/0138016 A1    May 21, 2015

(30) Foreign Application Priority Data
Nov. 7, 2013  (KR) .................. 10-2013-0135013

(51) Int. Cl.
*G01S 19/29* (2010.01)
*G01S 19/30* (2010.01)
(Continued)

(52) U.S. Cl.
CPC .............. *G01S 19/29* (2013.01); *G01S 19/30* (2013.01); *H03L 7/087* (2013.01); *H03L 7/093* (2013.01);
(Continued)

(58) Field of Classification Search
CPC ........ H04B 1/7183; H04B 2001/71566; H03L 7/02; H03L 7/06; H03L 7/07;
(Continued)

(56) References Cited

U.S. PATENT DOCUMENTS 5,477,195 A * 12/1995 Spilker .................. H04B 1/709
                                                        329/304
5,694,416 A * 12/1997 Johnson ................. H04B 1/126
                                                        342/368

(Continued)

*Primary Examiner* — Young T Tse
(74) *Attorney, Agent, or Firm* — NSIP Law

(57) ABSTRACT

A method of generating a correlation function for a CBOC (6,1,1/11) signal according to the present invention includes generating a delayed signal delayed based on a phase delay, with respect to a signal pulse train of a CBOC(6,1,1/11)-modulated received signal, generating first to twelfth partial correlation functions by performing an autocorrelation operation of the received signal and the delayed signal with respect to a total time, generating a basic intermediate correlation function by performing an elimination operation on sixth and seventh partial correlation functions, acquiring first to fifth and eighth to twelfth additional intermediate correlation functions by performing an elimination operation on each of partial correlation functions, excluding the sixth and seventh partial correlation functions from the first to twelfth partial correlation functions, and a basic intermediate correlation function, and acquiring the main correlation function by simply summing the basic intermediate correlation function and the first to fifth and eighth to twelfth additional intermediate correlation functions.

12 Claims, 8 Drawing Sheets

(51) Int. Cl.
*H03L 7/087* (2006.01)
*H04L 27/227* (2006.01)
*H03L 7/093* (2006.01)
*H03L 7/097* (2006.01)
*H03L 7/185* (2006.01)

(52) U.S. Cl.
CPC .............. *H03L 7/097* (2013.01); *H03L 7/185* (2013.01); *H04L 27/2278* (2013.01)

(58) Field of Classification Search
CPC ......... H03L 7/087; H03L 7/093; H03L 7/097; H03L 7/185; H04L 7/0079; H04L 7/033; H04L 7/041; H04L 7/042; H04L 7/043; H04L 27/2272; H04L 27/2278; H04L 27/2655; H04L 27/2657; G01S 5/145; G01S 19/29; G01S 19/30; G01S 19/38; G01S 19/39
USPC ....... 375/134, 137, 145, 149, 326, 327, 340, 375/341, 376; 370/350; 342/99–103, 342/356, 357.22; 455/427
See application file for complete search history.

(56) References Cited

U.S. PATENT DOCUMENTS

| | | | |
|---|---|---|---|
| 6,658,048 B1* | 12/2003 | Valio | G01S 19/30 342/357.52 |
| 2007/0205940 A1* | 9/2007 | Yang | G01S 19/24 342/357.59 |
| 2014/0191903 A1* | 7/2014 | Vigneau | G01S 19/44 342/357.68 |
| 2015/0022397 A1* | 1/2015 | Manohar | G01S 19/24 342/357.63 |
| 2015/0117499 A1* | 4/2015 | Chae | H04B 1/7085 375/150 |
| 2015/0124919 A1* | 5/2015 | Yoon | G01S 19/30 375/376 |
| 2015/0139282 A1* | 5/2015 | Chae | H04B 1/709 375/150 |
| 2015/0155908 A1* | 6/2015 | Chae | H04B 1/7075 375/140 |
| 2015/0222415 A1* | 8/2015 | Chae | H03L 7/06 375/376 |

* cited by examiner ary applications, the entire disclosure of which is incorporated herein by reference for all purposes.

BACKGROUND

1. Technical Field

The present invention relates generally to satellite navigation technology and, more particularly, to a scheme for tracking a composite binary offset carrier (CBOC) signal that is used for satellite navigation technology.

2. Description of the Related Art

Satellite navigation technology is technology that is configured such that, when a plurality of navigation satellites randomly transmits a plurality of satellite navigation signals, each containing information about the current location and time of the corresponding navigation satellite, to the ground, a satellite navigation receiver on the ground receives the plurality of satellite navigation signals, calculates the coordinates of the current locations of the navigation satellites and the arrival times of the signals, and determines its three-dimensional (3D) location in the Earth coordinate system using triangulation.

A satellite navigation receiver theoretically requires at least three satellite signals in order to determine its longitude, latitude and height, and requires one more satellite signal in order to improve accuracy by eliminating time error between satellites. Accordingly, at least four satellites are required.

Across the world, many countries have developed independent satellite navigation systems for economic and military reasons. Although the United States Global Positioning System (GPS) is most widely used and famous, the European Union's Galileo system, the Russian GLONASS, the Chinese COMPASS system, and the Japanese QZSS system (which will be expanded to the JRANS system in the future) are also being currently operated or developed.

Since satellite navigation signals should be robust to interference and jamming, various and elaborate modulation schemes have been employed. It is worthy of notice that the majority of the next-generation satellite navigation systems have replaced a conventional a phase shift keying (PSK) modulation scheme or have employed a BOC modulation scheme in addition to a PSK modulation scheme. The width of the main peak of an autocorrelation function used for the BOC modulation scheme is short, and thus the BOC modulation scheme exhibits better signal tracking performance than the PSK modulation scheme.

Furthermore, the BOC modulation scheme is characterized in that spectral separation occurs and energy is shifted from the center of a band to the periphery thereof, unlike the PSK modulation scheme, and thus the BOC modulation scheme can be additionally applied to a band in which a conventional modulation scheme has been used. Using these characteristics, the next-generation satellite navigation systems can employ the BOC modulation scheme in addition to the PSK modulation scheme, thereby being able to ensure the improvement of performance and backward compatibility.

A BOC signal is a signal that is expressed as a product of a pseudo random noise (PRN) code with a sine or cosine rectangular sub-carrier. A BOC signal is expressed as a $BOC_{sin}(kn,n)$ or a $BOC_{cos}(kn,n)$ depending on the type of sub-carrier, where k is a positive integer indicative of the ratio of the chip period of a PRN code to the period of a sub-carrier, and n is indicative of the ratio of PRN code chip transmission rate to 1.023 MHz, that is, the clock frequency of a C/A code.

Although a BOC signal has high signal tracking performance and excellent compatibility with the conventional PSK modulation scheme, it is problematic in that many side peaks occur around a main peak where an autocorrelation function has the highest value, unlike the PSK scheme having a single peak. A problem in which, upon tracking a BOC signal, synchronization is established with a side peak instead of a main peak due to the presence of side peaks, that is, the so-called ambiguity problem, may occur.

Meanwhile, in order to modernize the GPS system while maintaining its backward compatibility and provide compatibility between the GPS system and the Galileo system, a multiplexed BOC (MBOC) modulation method was proposed, and the U.S. and European authorities finally decided to adopt a so-called MBOC(6,1,1/11) modulation method in which a $BOC_{sin}(1,1)$ signal and a $BOC_{sin}(6,1)$ signal were combined at a power split ratio of 1/11 after discussion.

Interestingly, the U.S. and European authorities implemented different methods of synthesizing sub-carrier signals BOC(1,1) and BOC(6,1) that could satisfy the power spectrum density of the MBOC(6,1,1/11) modulation method. First, the U.S. authority implemented a time-multiplexed BOC (CBOC) using two sub-carriers BOC(1,1) and BOC(6,1) in the time domain in an non-overlap manner. In contrast, the European authority implemented a composite BOC (CBOC) in which a sub-carrier BOC(6,1) has been added to a sub-carrier BOC(1,1) along the time axis.

A CBOC modulation scheme is a method of simply summing a $BOC_{sin}(1,1)$ and $BOC_{sin}(6,1)$ in a weighted manner so that the power spectrum density of an MBOC(6,1,1/11) modulation scheme can be satisfied.

Meanwhile, a decision was made such that 50% of the power of a CBOC(6,1,1/11) signal was assigned to each of data and a pilot. For this purpose, the overall signal is divided into a CBOC(6,1,1/11,'+') signal for the transmission of a data component and a CBOC(6,1,1/11,'−') signal for signal synchronization using a pilot component.

The peak of the autocorrelation function of the CBOC(6,1,1/11) signal is sharper thanks to the advantage of a BOC(6,1) signal component, and thus can provide more accurate positioning performance than a general BOC modulated signal.

However, since the CBOC(6,1,1/11) signal has various side peaks around a main peak like a general BOC modulated signal, it still has the ambiguity problem upon signal tracking.

Proposed conventional schemes for eliminating the side peaks of a CBOC autocorrelation function are schemes for applying a conventional method of eliminating side peaks in a BOC signal without change or schemes for eliminating side peaks using a newly designed local signal. Although these schemes can actually eliminate side peaks, tracking performance is not improved.

RELATED TECHNICAL DOCUMENTS

Non-Patent Documents (Non-patent document 1) [1] F. Sousa, F. Nunes, and J. Leitao, "Code correlation reference waveforms for multipath mitigation in MBOC GNSS receivers," in Proc. ENG-GNSS, vol. 1, pp. 1-10, Toulouse, France, April 2008.
(Non-patent document 2) [2] Z. Yao, M. Lu, and Z. Feng, "Unambiguous technique for multiplexed binary offset carrier modulated signals tracking," IEEE Signal Process., Lett., vol. 16, no. 7, pp. 608-611, July 2009
(Non-patent document 3) [3] Y.-P. Lee and S. Yoon, "A side-peak cancellation scheme for CBOC code acquisition," International Journal of World Academy of Science, Engineering and Technology, vol. 69, pp. 685-687, September 2012.

SUMMARY

An object of the present invention is to provide a method of generating an unambiguous correlation function for a CBOC(6,1,1/11) signal, an apparatus for tracking a CBOC signal, and a satellite navigation signal receiver system using the same.

An object of the present invention is to provide a method of generating an unambiguous correlation function for a CBOC(6,1,1/11) signal based on partial correlation functions constituting a CBOC signal, an apparatus for tracking a CBOC signal, and a satellite navigation signal receiver system using the same.

An object of the present invention is to provide a method of generating an unambiguous correlation function based on partial correlation functions, an apparatus for tracking a CBOC signal, and a satellite navigation signal receiver system using the same, which have been developed based on the unique characteristics of a CBOC signal without using a conventional correlation function generation scheme developed for a BOC signal.

The objects of the present invention are not limited to the above-described objects, and other objects that have not been described above will be clearly understood by those skilled in the art from the following description.

In accordance with an aspect of the present invention, there is provided a delay lock loop (DLL), including:

a local signal generation unit configured to generate an early and late delayed signal pair $B(t+\tau+\Delta/2)$ and $B(t+\tau-\Delta/2)$ early and late delayed, respectively, based on a phase delay $\tau$ and a delay value difference $\Delta$ provided by a numerical control oscillator (NCO), with respect to a signal pulse train of a CBOC(6,1,1/11)-modulated received signal $B(t)$;

early and late autocorrelation units configured to generate first to twelfth early partial correlation functions $\{S_m(\tau+\Delta/2)\}_{m=0}^{11}$ and first to twelfth late partial correlation functions $\{S_m(\tau-\Delta/2)\}_{m=0}^{11}$ by performing an autocorrelation operation of early and late mixing signal pairs with respect to a total time T $(0 \leq t \leq T)$;

early and late basic intermediate correlation function generation units configured to generate an early basic intermediate correlation function $R_a(\tau+\Delta/2)$ by performing an elimination operation on sixth and seventh early partial correlation functions $S_5(\tau+\Delta/2)$ and $S_6(\tau+\Delta/2)$, and to generate a late basic intermediate correlation function $R_a(\tau-\Delta/2)$ by performing an elimination operation on sixth and seventh late partial correlation functions $S_5(\tau-\Delta/2)$ and $S_6(\tau-\Delta/2)$;

an early additional intermediate correlation function generation unit configured to acquire first to fifth and eighth to twelfth early additional intermediate correlation functions $\{R_m(\tau+\Delta/2)\}_{m=0, m \neq 5,6}^{11}$ by performing an elimination operation on each of remaining 10 early partial correlation functions $\{S_m(\tau+\Delta/2)\}_{m=0, m \neq 5,6}^{11}$, excluding the sixth and seventh early partial correlation functions $S_5(\tau+\Delta/2)$ and $S_6(\tau+\Delta/2)$ from the first to twelfth early partial correlation functions $\{S_m(\tau+\Delta/2)\}_{m=0}^{11}$, and an early basic intermediate correlation function $R_a(\tau+\Delta/2)$;

a late additional intermediate correlation function generation unit configured to acquire first to fifth and eighth to twelfth late additional intermediate correlation functions $\{R_m(\tau-\Delta/2)\}_{m=0, m \neq 5,6}^{11}$ by performing an elimination operation on each of the remaining ten late partial correlation functions $\{S_m(\tau-\Delta/2)\}_{m=0, m \neq 5,6}^{11}$, excluding the sixth and seventh late partial correlation functions $S_5(\tau-\Delta/2)$ and $S_6(\tau-\Delta/2)$ from the first to twelfth late partial correlation functions $\{S_m(\tau-\Delta/2)\}_{m=0}^{11}$, and the late basic intermediate correlation function $R_a(\tau-\Delta/2)$;

early and late combination units configured to acquire the early main correlation function $R_{proposed}(\tau+\Delta/2)$ by simply summing the early basic intermediate correlation function $R_a(\tau+\Delta/2)$ and the first to fifth and eighth to twelfth early additional intermediate correlation functions $\{R_m(\tau+\Delta/2)\}_{m=0, m \neq 5,6}^{11}$, and to acquire the late main correlation function $R_{proposed}(\tau-\Delta/2)$ by simply summing the late basic intermediate correlation function $R_a(\tau-\Delta/2)$ and the first to fifth and eighth to twelfth late additional intermediate correlation functions $\{R_m(\tau-\Delta/2)\}_{m=0, m \neq 5,6}^{11}$; and the NCO configured to determine a phase delay $\tau$ for the received signal based on discrimination output of a discrimination function based on values of the early and late main correlation functions, and to output the determined phase delay $\tau$ to the local signal generation unit;

wherein the elimination operation an operation that satisfies $|A|+|B|-|A-B|$ with respect to A and B.

According to an embodiment, the first to twelfth early partial correlation functions $\{S_m(\tau+\Delta/2)\}_{m=0}^{11}$ and the twelfth late partial correlation functions $\{S_m(\tau-\Delta/2)\}_{m=0}^{11}$ may be acquired as results of autocorrelation operations based on partial received signals including pulses at respective pulse locations of the received signal B(t) in accordance with the following equation:

$$R(\tau) = \sum_{m=0}^{11} \left\{ \sum_{i=-\infty}^{\infty} \frac{\sqrt{P}}{PT} \int_0^T B(t) h_i r_{T_c}(t+\tau-iT_c) s_m(t+\tau) dt \right\}$$

$$= \sum_{m=0}^{11} \left\{ \sum_{i=0}^{T/T_c-1} \frac{1}{PT} \int_{(12j+m)T_s}^{(12j+m+1)T_s} B(t)B(t+\tau) dt \right\}$$

$$= \sum_{m=0}^{11} S_m(\tau)$$

where P is power of the received signal B(t), T is a period of a pseudo noise code, $h_i \in \{-1, 1\}$ is an i-th chip of a PRN code having a period T, $T_c$ is a period of a PRN code chip, $r_{T_c}(t)$ is a unit square wave present in $[0, T_c]$, d(t) is navigation data, and $s_m(t)$ is a pulse at an m-th ($0 \leq m \leq 11$) pulse location among 12 pulses present in each chip period $T_c$.

According to an embodiment, the early basic intermediate correlation function $R_a(\tau+\Delta/2)$ and late basic intermediate correlation function $R_a(\tau-\Delta/2)$ may be generated based on the following equation:

$$R_a(\tau) = S_5(\tau) \ominus S_6(\tau)$$
$$= |S_5(\tau)| + |S_6(\tau)| - |S_5(\tau) - S_6(\tau)|$$

According to an embodiment, the early additional intermediate correlation functions $R_m(\tau+\Delta/2)$ and the late additional intermediate correlation functions $R_m(\tau-\Delta/2)$ may be generated based on the following equation:

$$R_m(\tau) = R_a(\tau) \ominus S_m(\tau)$$
$$= |R_a(\tau)| + |S_m(\tau)| - |R_a(\tau) - S_m(\tau)|$$

According to an embodiment, the early additional intermediate correlation function generation unit may operate to acquire first to twelfth early additional intermediate correlation functions $\{(R_m(+\Delta/2)\}_{m=0}^{11}$ by performing an elimination operation on each of the first to twelfth early partial correlation functions $\{S_m(\tau+\Delta/2)\}_{m=0}^{11}$ and the early basic intermediate correlation function $R_a(\tau+\Delta/2)$; and the late additional intermediate correlation function generation unit may operate to acquire first to twelfth late additional intermediate correlation functions $\{R_m(\tau-\Delta/2)\}_{m=0}^{11}$ by performing an elimination operation on each of the first to twelfth late partial correlation functions $\{S_m(\tau-\Delta/2)\}_{m=0}^{11}$ and the late basic intermediate correlation function $R_a(\tau-\Delta/2)$.

According to an embodiment, the early combination unit may operate to acquire the early main correlation function $R_{proposed}(\tau+\Delta/2)$ by simply summing the early basic intermediate correlation function $R_a(\tau+\Delta/2)$ and the first to twelfth early additional intermediate correlation functions $\{R_m(\tau+\Delta/2)\}_{m=0}^{11}$; and the late combination unit may operate to acquire the late main correlation function $R_{proposed}(\tau-\Delta/2)$ by simply summing the late basic intermediate correlation function $R_a(\tau-\Delta/2)$ and the first to twelfth late additional intermediate correlation functions $\{R_m(\tau-\Delta/2)\}_{m=0}^{11}$.

In accordance with another aspect of the present invention, there is provided a method of tracking a CBOC(6,1,1/11) modulated signal, including:

generating an early and late delayed signal pair $B(t+\tau+\Delta/2)$ and $B(t+\tau-\Delta/2)$, early and late delayed, respectively, based on a phase delay $\tau$ and a delay value difference $\Delta$ provided by an NCO, with respect to a signal pulse train of a CBOC(6,1,1/11)-modulated received signal $B(t)$;

generating first to twelfth early partial correlation functions $\{S_m(\tau+\Delta/2)\}_{m=0}^{11}$ and first to twelfth late partial correlation functions $\{S_m(\tau-\Delta/2)\}_{m=0}^{11}$ by performing an autocorrelation operation of early and late mixing signal pairs with respect to a total time T ($0 \leq t \leq T$);

generating an early basic intermediate correlation function $R_a(\tau+\Delta/2)$ by performing an elimination operation on sixth and seventh early partial correlation functions $S_5(\tau+\Delta/2)$ and $S_6(\tau+\Delta/2)$, and generating a late basic intermediate correlation function $R_a(\tau-\Delta/2)$ by performing an elimination operation on sixth and seventh late partial correlation functions $S_5(\tau-\Delta/2)$ and $S_6(\tau-\Delta/2)$;

acquiring first to fifth and eighth to twelfth early additional intermediate correlation functions $\{R_m(\tau+\Delta/2)\}_{m=0,m\neq5,6}^{11}$ by performing an elimination operation on each of remaining 10 early partial correlation functions $\{S_m(\tau+\Delta/2)\}_{m=0,m\neq5,6}^{11}$, excluding the sixth and seventh early partial correlation functions $S_5(\tau+\Delta/2)$ and $S_6(\tau+\Delta/2)$ from the first to twelfth early partial correlation functions $\{S_m(\tau+\Delta/2)\}_{m=0}^{11}$, and an early basic intermediate correlation function $R_a(\tau+\Delta/2)$;

acquiring first to fifth and eighth to twelfth late additional intermediate correlation functions $\{R_m(\tau-\Delta/2)\}_{m=0,m\neq5,6}^{11}$ by performing an elimination operation on each of the remaining ten late partial correlation functions $\{S_m(\tau-\Delta/2)\}_{m=0,m\neq5,6}^{11}$, excluding the sixth and seventh late partial correlation functions $S_5(\tau-\Delta/2)$ and $S_6(\tau-\Delta/2)$ from the first to twelfth late partial correlation functions $\{S_m(\tau-\Delta/2)\}_{m=0}^{11}$, and the late basic intermediate correlation function $R_a(\tau-\Delta/2)$;

acquiring the early main correlation function $R_{proposed}(\tau+\Delta/2)$ by simply summing the early basic intermediate correlation function $R_a(\tau+\Delta/2)$ and the first to fifth and eighth to twelfth early additional intermediate correlation functions $\{R_m(\tau+\Delta/2)\}_{m=0,m\neq5,6}^{11}$, and acquiring the late main correlation function $R_{proposed}(\tau-\Delta/2)$ by simply summing the late basic intermediate correlation function $R_a(\tau-\Delta/2)$ and the first to fifth and eighth to twelfth late additional intermediate correlation functions $\{R_m(\tau-\Delta/2)\}_{m=0,m\neq5,6}^{11}$; and determining a phase delay $\tau$ for the received signal based on discrimination output of a discrimination function based on values of the early and late main correlation functions, and outputting the determined phase delay $\tau$;

wherein the elimination operation is an operation that satisfies $|A|+|B|-|A-B|$ with respect to A and B.

In accordance with still another aspect of the present invention, there is provided a method of generating a correlation function for a CBOC(6,1,1/11) signal, including:

generating a delayed signal $B(t+\tau)$ delayed based on a phase delay $\tau$, with respect to a signal pulse train of a CBOC(6,1,1/11)-modulated received signal $B(t)$;

generating first to twelfth partial correlation functions $\{S_m(\tau)\}_{m=0}^{11}$ by performing an autocorrelation operation of the received signal $B(t)$ and the delayed signal $B(t+\tau)$ with respect to a total time T ($0 \leq t \leq T$);

generating a basic intermediate correlation function $R_a(\tau)$ by performing an elimination operation on sixth and seventh partial correlation functions $S_5(\tau)$ and $S_6(\tau)$;

acquiring first to fifth and eighth to twelfth additional intermediate correlation functions $\{R_m(\tau)\}_{m=0,m\neq5,6}^{11}$ by performing an elimination operation on each of partial correlation functions $\{S_m(\tau)\}_{m=0,m\neq5,6}^{11}$, excluding the sixth and seventh partial correlation functions $S_5(\tau)$ and $S_6(\tau)$ from the first to twelfth partial correlation functions $\{S_m(\tau)\}_{m=0}^{11}$, and a basic intermediate correlation function $R_a(\tau)$; and acquiring the main correlation function $R_{proposed}(\tau)$ by simply summing the basic intermediate correlation function $R_a(\tau)$ and the first to fifth and eighth to twelfth additional intermediate correlation functions $\{R_m(\tau)\}_{m=0,m\neq5,6}^{11}$; and wherein the elimination operation is an operation that satisfies $|A|+|B|-|A-B|$ with respect to A and B.

In accordance with still another aspect of the present invention, there is provided an apparatus for tracking a CBOC signal, including:

a frequency offset compensation unit configured to output a compensated received signal compensated for frequency offset of a carrier frequency based on a carrier frequency compensation value with respect to a CBOC(6,1,1/11)-modulated received signal;

a local code generation unit configured to generate a delay-compensated local code based on a code delay value;

a mixer configured to mix the delay-compensated local code with the frequency offset-compensated received signal;

a DLL configured to repeatedly track and calculate a code delay value that allows a correlation value obtained by correlating the delay-compensated local signal and the frequency offset-compensated received signal with each other is located at an apex of a main peak of a correlation function, and to provide the calculated code delay value to the local code generation unit;

a phase lock loop (PLL) configured to repeatedly calculate a carrier frequency compensation value based on an autocorrelation value of a local code, based on the tracked code delay value, so that a phase error of a carrier signal can be minimized, and to provide the carrier frequency compensation value to the frequency offset compensation unit; and a data extraction unit configured to extract spreading data from a mixture of the delay-compensated local code and the compensated received signal;

wherein the DLL operates to:

acquire first to fifth and eighth to twelfth additional intermediate correlation functions by performing an elimination operation on a basic intermediate correlation function, generated by performing an elimination operation on sixth and seventh partial correlation functions among first to twelfth partial correlation functions constituting an autocorrelation function of a CBOC(6,1,1/11) modulated received signal, and each of the first to fifth and eighth to twelfth partial correlation functions, exclusive of the sixth and seventh partial correlation functions; and acquire a main correlation function having only a main peak by superposing the basic intermediate correlation function and the first to fifth and eighth to twelfth additional intermediate correlation functions on each other; and wherein the elimination operation is an operation that satisfies $|A|+|B|-|A-B|$ with respect to A and B.

According to an embodiment, the DLL may operate to:

acquire first to twelfth additional intermediate correlation functions by performing an elimination operation on a basic intermediate correlation function, generated by performing an elimination operation on sixth and seventh partial correlation functions among first to twelfth partial correlation functions constituting an autocorrelation function of a CBOC(6,1,1/11) modulated received signal, and each of the first to twelfth partial correlation functions; and acquire a main correlation function having only a main peak by superposing the basic intermediate correlation function and the first to twelfth additional intermediate correlation functions on each other According to an embodiment, the data extraction unit may operate to extract satellite navigation data and estimate a pseudorange based on the extracted navigation data.

In accordance with still another aspect of the present invention, there is provided a satellite navigation signal receiver system, including:

a front end unit configured to output a received signal obtained by CBOC(6,1,1/11)-modulating a signal in space (SIS) received from an antenna;

a baseband processing unit configured to acquire and track a code delay value with respect to the output received signal using a DLL, to compensate for carrier frequency offset using a PLL, and to extract the contained data from a code delay-compensated local code and a frequency offset-compensated compensated received signal; and an application function processing unit configured to perform a predetermined application function based on the extracted contained data;

wherein the baseband processing unit operates to:

generate a delayed signal $B(t+\tau)$ delayed based on a phase delay $\tau$, with respect to a signal pulse train of a CBOC(6,1,1/11)-modulated received signal $B(t)$;

generate first to twelfth partial correlation functions $\{S_m(\tau)\}_{m=0}^{11}$ by performing an autocorrelation operation of the received signal $B(t)$ and the delayed signal $B(t+\tau)$ with respect to a total time T ($0 \leq t \leq T$);

generate a basic intermediate correlation function $R_a(\tau)$ by performing an elimination operation on sixth and seventh partial correlation functions $S_5(\tau)$ and $S_6(\tau)$;

acquire first to fifth and eighth to twelfth additional intermediate correlation functions $\{R_m(\tau)\}_{m=0,m\neq 5,6}^{11}$ by performing an elimination operation on each of partial correlation functions $\{S_m(\tau)\}_{m=0,m\neq 5,6}^{11}$, excluding the sixth and seventh partial correlation functions $S_5(\tau)$ and $S_6(\tau)$ from the first to twelfth partial correlation functions $\{S_m(\tau)\}_{m=0}^{11}$, and a basic intermediate correlation function $R_a(\tau)$;

acquire the main correlation function $R_{proposed}(\tau)$ by simply summing the basic intermediate correlation function $R_a(\tau)$ and the first to fifth and eighth to twelfth additional intermediate correlation functions $\{R_m(\tau)\}_{m=0,m\neq 5,6}^{11}$; and if it is determined based on a filtered discrimination output that a value of the main correlation function $R_{proposed}(\tau)$ based on the phase delay $\tau$ is located at an apex of a main peak, output a value of the phase delay $\tau$ at that time as a code delay value; and wherein the elimination operation is an operation that satisfies $|A|+|B|-|A-B|$ with respect to A and B.

The present invention provides the method of generating an unambiguous correlation function for a CBOC(6,1,1/11) signal, the apparatus for tracking a CBOC signal, and the satellite navigation signal receiver system using the same. These apparatus and the method can overcome the disadvantage of conventional CBOC signal tracking schemes in which the advantages of a BOC(6,1) signal cannot be utilized, and thus can be applied to a CBOC(6,1/11) signal.

The present invention provides the method of generating an unambiguous correlation function for a CBOC(6,1,1/11) signal, the apparatus for tracking a CBOC signal, and the satellite navigation signal receiver system using the same. These apparatus and the method can completely eliminate side peaks, and the proposed unambiguous correlation function is considerably sharper and higher than the autocorrelation function.

The advantages of the present invention are not limited to the above-described advantages, and other advantages that have not been described above will be clearly understood by those skilled in the art from the following description.

DETAILED DESCRIPTION

Figure 1:
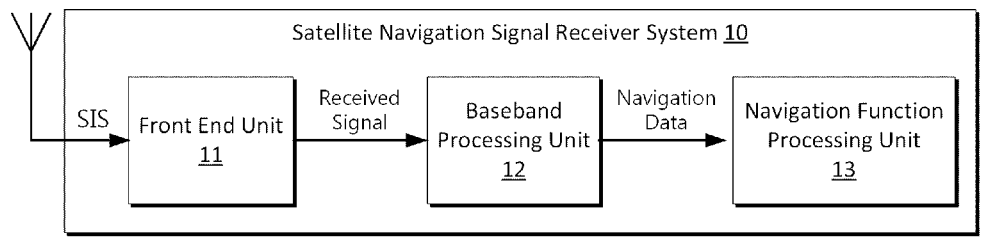
FIG. 1 is a block diagram illustrating a satellite navigation signal receiver system according to an embodiment of the present invention.

With regard to embodiments of the present invention disclosed herein, specific structural and functional descriptions are given merely for the purpose of illustrating the embodiments of the present invention. Embodiments of the present invention may be practiced in various forms, and the present invention should not be construed as being limited to embodiments disclosed herein.

Embodiments of the present invention will be described in detail below with reference to the accompanying drawings. The same reference numerals will be used to denote the same components throughout the accompanying drawings, and descriptions of the same components will be omitted.

FIG. 1 is a block diagram illustrating a satellite navigation signal receiver system 10 according to an embodiment of the present invention.

Referring to FIG. 1, the satellite navigation signal receiver system 10 includes an antenna, a front end unit 11, a baseband processing unit 12, and a navigation function processing unit 13.

A signal in space (SIS) emitted from a navigation satellite and received by the antenna is subjected to tuning, down conversion, filtering, amplification, and digital sampling by the front end unit 11, and is then output as a digital received signal.

The baseband processing unit 12 may acquire and track code delay using a delay lock loop (DLL) for acquiring and tracking signal synchronization based on a signal correlation scheme with respect to the output received signal, may compensate for carrier frequency offset using a phase lock loop (PLL) in order to compensate for the fading or Doppler effect, and may extract synchronized satellite navigation data from a code delay-compensated local signal and a frequency offset-compensated received signal.

In particular, the baseband processing unit 12 may generate the pseudorange from the satellite to the satellite navigation signal receiver system 10 based on the satellite navigation data, and may output the pseudorange.

Furthermore, the baseband processing unit 12 may extract phase measurement data, satellite location data (almanac), satellite clock information, satellite orbit data (ephemeris), etc. from the compensated received signal, in addition to the pseudorange.

In this case, as will be described below, the baseband processing unit 12 of the satellite navigation signal receiver system 10 according to the present embodiment may generate a main correlation function by summing a basic intermediate correlation function generated by performing an elimination operation on a sixth and seventh partial correlation function pair among 12 partial correlation functions constituting the autocorrelation function of a CBOC(6,1,1/11) modulated received signal and additional intermediate correlation functions generated by performing an elimination operation on each of the 12 partial correlation functions and the basic intermediate correlation function or by performing an elimination operation on each of the remaining ten partial correlation functions, excluding the sixth and seventh partial correlation functions from the 12 partial correlation functions, and the basic intermediate correlation function, and then may accurately acquire and track a code phase delay based on the main correlation function having only a main peak.

The navigation function processing unit 13 may calculate the coordinates and movement of the receiver system 10 based on pseudoranges obtained for a plurality of satellites.

In this case, for example, the navigation function processing unit 13 may calculate the 2D coordinates of the satellites navigation receiver system 10 from the pseudoranges obtained for three satellites, and may calculate 3D coordinates from the pseudoranges obtained for at least four satellites.

Figure 2:
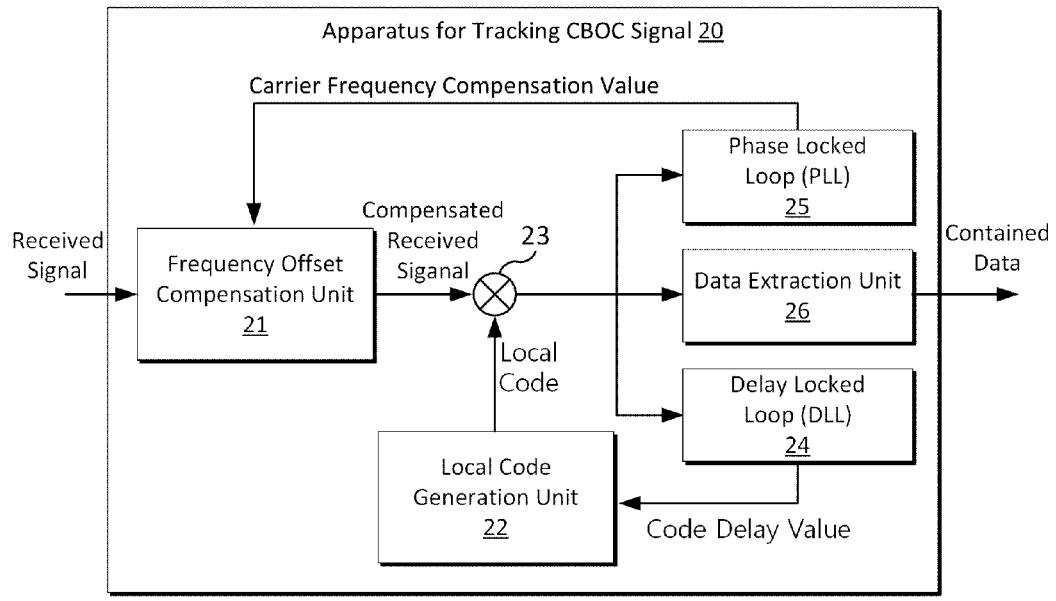
FIG. 2 is a block diagram illustrating an apparatus for tracking a CBOC signal according to an embodiment of the present invention.

FIG. 2 is a block diagram illustrating an apparatus for tracking a CBOC signal according to an embodiment of the present invention.

The baseband processing unit 12 of the satellite navigation signal receiver system 10 of FIG. 1 may acquire and track code delay using circuits, such as an apparatus 20 for tracking a CBOC signal illustrated in FIG. 2.

Referring to FIG. 2, the apparatus 20 for tracking a CBOC signal may include a frequency offset compensation unit 21, a local code generation unit 22, a mixer 23, a DLL 24, a PLL 25, and a data extraction unit 26.

When the apparatus 20 for tracking a CBOC signal receives a CBOC received signal, it takes time for the CBOC received signal to reach the receiver system 10, and carrier frequency offset occurs during propagation due to the fading or Doppler effect. Accordingly, in order to accurately track and demodulate the CBOC received signal, a code delay value and carrier frequency offset should be known.

Since it is impossible to know a code delay value and a frequency offset value or they should be inaccurately estimated when a CBOC signal is received first, the code delay value should be determined or a carrier frequency should be compensated via the DLL 24 or PLL 25.

First, the frequency offset compensation unit 21 outputs a compensated received signal obtained by compensating the CBOC received signal for carrier frequency fading or frequency offset attributable to the Doppler effect based on a carrier frequency compensation value provided by the PLL 25. Since there is no information used to compensate for calculated carrier frequency offset in the beginning stage, a default value or a previous estimated value may be applied.

The local code generation unit 22 generates a delay-compensated local code based on a code delay value that is calculated by the DLL 24. Since there is no calculated code delay value in the beginning stage, a default value or a previous estimated value may be applied.

The mixer 23 mixes the delay-compensated local code and the frequency deviation-compensated compensated received signal.

The DLL 24 repeatedly tracks and calculates a code delay value that allows a correlation value, obtained by performing a predetermined correlation operation on the delayed received signal based on the compensated received signal and a predetermined code delay value, to be located at the main peak of a main correlation function, and provides the calculated code delay value to the local code generation unit 22.

More specifically, as will be described in detail later, the DLL 24 may acquire a main correlation function by summing a basic intermediate correlation function generated by performing an elimination operation on a sixth and seventh partial correlation function pair among 12 partial correlation functions constituting the autocorrelation function of a CBOC(6,1,1/11) modulated received signal and additional intermediate correlation functions generated by performing an elimination operation on each of the 12 partial correlation functions and the basic intermediate correlation function or by performing an elimination operation on each of the remaining ten partial correlation functions, excluding the sixth and seventh partial correlation functions from the 12 partial correlation functions, and the basic intermediate correlation function.

In this case, as will be described in connection with Equation 5, throughout the present specification and the attached claims, an elimination operation refers to an operation based on algebraic relations in which $|A|+|B|-|A-B|=0$ if real numbers A and B satisfy $xy \leq 0$ and $|A|+|B|-|A-B|>0$ if the real numbers A and B satisfy $AB>0$.

The main correlation function according to the present invention can eliminate all side peaks, other than a main peak, and is sharper at its center and has a main peak having a larger height than an autocorrelation function, thereby being able to improve tracking performance.

The PLL 25 repeatedly compensates a carrier frequency based on the autocorrelation value of the local code, based on the tracked code delay value, so that the phase error of a carrier signal can be minimized, and then provides a carrier frequency compensation value to the frequency offset compensation unit 21.

After the compensated received signal has been appropriately acquired and tracked, the data extraction unit 26 may accurately extract synchronized data, such as satellite navigation data modulated into a PRN code on a satellite side, from a mixture of the delay-compensated local code and the frequency deviation-compensated compensated received signal.

Furthermore, the data extraction unit 26 may estimate the pseudorange to the satellite based on the extracted satellite navigation data.

Figure 3:
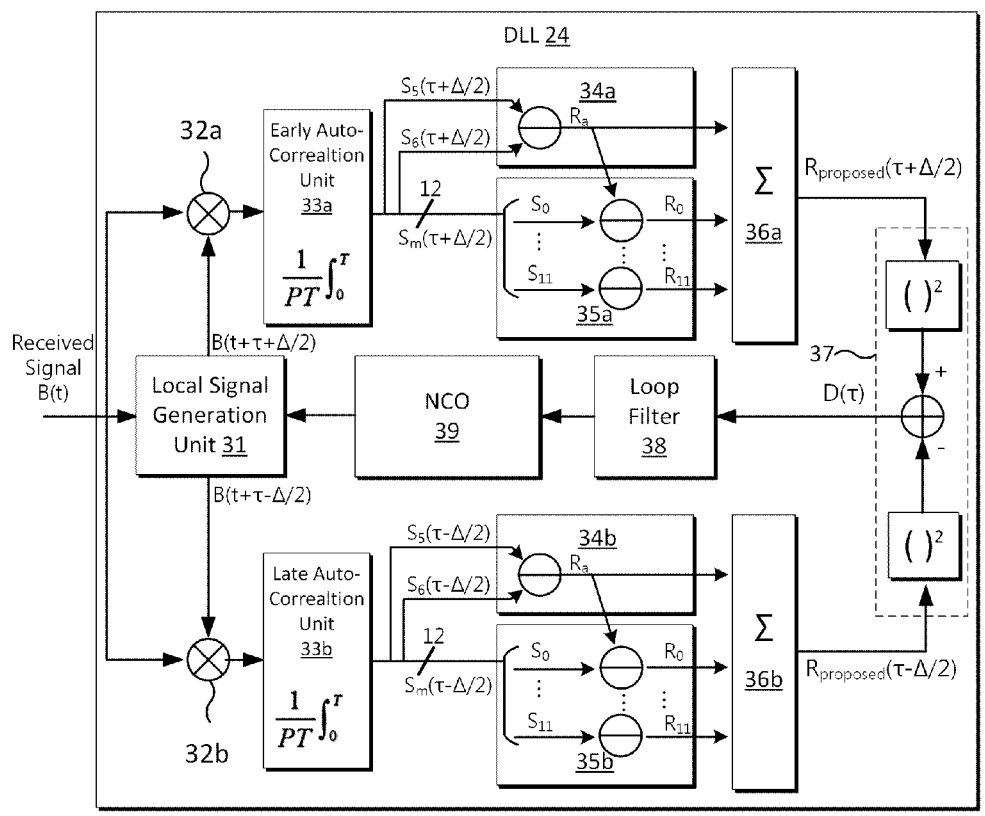
FIG. 3 is a block diagram illustrating the DLL of the apparatus for tracking a CBOC signal according to the present embodiment.

FIG. 3 is a block diagram illustrating the DLL of the apparatus for tracking a CBOC signal according to the present embodiment.

More specifically, the DLL 24 includes a local signal generation unit 31, early and late mixers 32*a* and 32*b*, early and late autocorrelation units 33*a* and 33*b*, early and late basic intermediate correlation function generation units 34*a* and 34*b*, early and late intermediate correlation function generation units 35*a* and 35*b*, early and late combination units 36*a* and 36*b*, a discriminator mixer 37, a loop filter 38, and a numerical control oscillator (NCO) 39.

The conventional apparatus for tracking a BOC signal performs a correlation operation on priori known spreading codes, provided by the local signal generation unit, and the received signal and then acquire a spreading code having the largest correlation value and its synchronization, at the step of acquiring the spreading code of the BOC signal and its synchronization; and outputs the delayed received signal via a local code generation unit, performs autocorrelation on the delayed received signal and the received signal, and then finds a code delay phase that exhibits a main peak having the largest correlation value, at the step of tracking code delay after the acquisition.

As described above, the autocorrelation function of a CBOC signal has a plurality of side peaks. In order to overcome this problem, first, the early and late basic intermediate correlation function generation units 34*a* and 34*b* according to the present embodiment acquire a basic intermediate correlation function by performing an elimination operation on sixth and seventh partial correlation functions constituting the autocorrelation function of the received signal, instead of using the autocorrelation function of the received signal without change.

Next, in the same manner, the early and late additional intermediate correlation function generation units 35*a* and 35*b* of the present invention acquire additional intermediate correlation functions by performing an elimination operation on the basic intermediate correlation function, generated by performing an elimination operation on the sixth and seventh partial correlation functions among the 12 partial correlation functions constituting the autocorrelation function of the received signal, and each of the 12 partial correlation functions or by performing an elimination operation on the basic intermediate correlation function and each of the remaining ten partial correlation functions, excluding the sixth and seventh partial correlation functions from the 12 partial correlation functions, instead of using the autocorrelation function of the received signal without change.

Next, the early and late combination units 36*a* and 36*b* according to the present invention may provide a main correlation function having only a main peak by interposing the basic intermediate correlation function and 12 additional intermediate correlation functions (or 10 additional intermediate correlations in some embodiments).

In this case, the autocorrelation operation refers to an operation that multiplies a sampled signal $X(t+\tau)$ by a signal $X(t)$ while gradually changing the delay time $\tau$ of the signal $X(t)$ with respect to the signal $X(t)$. Generally, when the signal $X(t)$ repeats a specific pattern, the autocorrelation value of the signals $X(t)$ and the $X(t+\tau)$ appears to be considerably large if the delay time $\tau$ is equal to the period of the pattern and appears to be small (that is, the correlation function appears in the form of a peak) if the delay time $\tau$ is not equal to the period of the pattern. Accordingly, when time delay for which the result of the autocorrelation operation appears to be largest is found, the value of the found time delay is the period of the signal X(t).

If a signal X(t) is a preamble indicative of the start of a synchronized signal, signal synchronization may be coarsely acquired using an autocorrelation operation.

Furthermore, after the signal synchronization has been acquired, signal synchronization may be finely tracked via an autocorrelation operation.

In general, there are some schemes for tracking the apex of the peak of a correlation function. For example, there is a scheme using the aspect of changes in the values of prompt correlation based on currently applied delay time, early correlation preceding the prompt correlation, and late correlation following the prompt correlation.

For example, if correlation values appear in order of early correlation, prompt correlation and late correlation or in reverse order, the prompt correlation may be viewed as being located on a slope of a peak. If the correlation value of prompt correlation is highest and the values of early correlation and late correlation are lower than the former value, this means that the prompt correlation is located near the apex of a peak.

As described above, in the CBOC(6,1,1/11) modulation scheme, 50% of power is assigned to a data signal component, and 50% of power is assigned to a pilot signal component. The data signal component uses a CBOC(6,1,1/11,'+') signal, whereas the pilot signal component uses a CBOC(6,1,1/11,'−') signal. Although the following scheme is substantially based on the CBOC(6,1,1/11,'−') signal because a synchronization operation is based on a pilot signal component, the following scheme may be theoretically applied to the CBOC(6,1,1/11,'+') signal in the same manner. Throughout the present specification, the CBOC(6,1,1/11) signal refers to a CBOC(6,1,1/11,'−') signal unless otherwise specified.

A CBOC(6,1,1/11) modulated baseband received signal B(t) may be expressed by the following Equation 1:

$$B(t) = \sqrt{P} \sum_{i=-\infty}^{\infty} h_i r_{T_c}(t - iT_c) d(t) s_{sc}(t) \quad (1)$$

where P is the power of a CBOC-modulated received signal, $h_i \in \{-1,1\}$ is the i-th chip of a code, for example, a PRN code, having a period T, $T_c$ is the period of a PRN code chip, $r_{T_c}(t)$ is a unit square wave present in $[0, T_c]$, and d(t) is navigation data. Meanwhile, a pilot signal component does not have data, and thus the navigation data d(t) is considered to be 1.

$s_{sc}(t)$ is the waveform of a sub-carrier that is present in a single PRN code chip of the CBOC(6,1,1/11, '−') signal. Since the PRN code chip in the CBOC(6,1,1/11,'−') signal is modulated in such a way that a BOC(6,1) signal is added to a BOC(1,1) signal by a simple additive weighting method as described above, the sub-carrier $s_{sc}(t)$ may be expressed by the following Equations 2 and 3 when BOC(1,1) and BOC(6,1) sub-carrier components constituting the sub-carrier $s_{sc}(t)$ are $s_{(1,1)}(t)$ and $s_{(6,1)}(t)$, respectively, as in the following Equation 3:

$$s_{sc}(t) = \sqrt{\frac{10}{11}} s_{(1,1)}(t) - \sqrt{\frac{1}{11}} s_{(6,1)}(t) \quad (2)$$

$$\begin{cases} s_{(1,1)}(t) = \sum_{m=0}^{1} (-1)^m r_{6T_s}(t - iT_c - 6mT_s), \\ s_{(6,1)}(t) = \sum_{m=0}^{11} (-1)^m r_{T_s}(t - iT_c - mT_s) \end{cases} \quad (3)$$

In Equations 2 and 3, the sub-carrier $s_{sc}(t)$ is generated by adding the BOC(6,1) signal having a shorter period and a larger size to the BOC(1,1) signal having a longer period and a smaller size. Since the BOC(1,1) signal is composed of positive and negative pulses having a period of $T_c/2$ and the BOC(6,1) signal is composed of positive and negative pulses having a period $T_s=T_c/12$, the CBOC(6,1,1/11,'−') signal appears to have a waveform in which 3 or 6 sawteeth have been attached to each of the larger positive and negative pulses of the BOC(1,1) signal waveform. In this case, a single waveform appearing to be a sawtooth is a waveform that appears when positive and negative pulses each having a period $T_s$ successively appear.

Accordingly, when the sub-carrier of each period $T_c$ of the CBOC(6,1,1/11,'−') signal is viewed as a train of 12 successive partial sub-carrier pulses having the sub-carrier period $T_s$ of the BOC(6,1) signal, the sub-carrier $s_{sc}(t)$ of a single period $T_c$ of the CBOC(6,1,1/11,'−') signal may be represented by the time series sum of 12 partial sub-carrier pulses $s_m(t)$, as in the following Equation 4:

$$s_{sc}(t) = \sum_{m=0}^{11} s_m(t) \quad (4)$$

If the length T of the received CBOC(6,1,1/11,'−') signal is considerably longer than the chip period $T_c$, the received signal B(t) may be considered to be the sum of 12 partial received signals acquired by extracting an m-th (0≤m≤11) pulse location pulse $s_m(t)$ from among 12 partial sub-carrier pulses, present within each chip period $T_c$, in the chip period $T_s$.

In other words, a first partial received signal is a pulse train including only pulses at the first (m=0) pulse locations of respective chips and having a length of $T/T_c$, and a second partial received signal is a pulse train including only pulses at the second (m=1) pulse locations of respective chips and having a length of $T/T_c$. A twelfth, that is, last, partial received signal is a pulse train including only pulses at the last (m=11) pulse locations of respective chips and a length of $T/T_c$.

Accordingly, an autocorrelation function R(τ) may be represented by the superposition of the results of autocorrelation operations based on 12 partial received signals including pulses at each pulse location of the received signal B(t), that is, the 12 partial correlation functions, as in the following Equation 5:

$$R(\tau) = \sum_{m=0}^{11} \left\{ \sum_{i=-\infty}^{\infty} \frac{\sqrt{P}}{PT} \int_0^T B(t) h_i r_{T_C}(t + \tau - iT_c) s_m(t + \tau) dt \right\} \quad (5)$$

$$= \sum_{m=0}^{11} \left\{ \sum_{i=0}^{T/T_c - 1} \frac{1}{PT} \int_{(12j+m)T_s}^{(12j+m+1)T_s} B(t) B(t + \tau) dt \right\}$$

$$= \sum_{m=0}^{11} S_m(\tau)$$

where P is the power of the received signal B(t), and T is the period of the pseudo noise code.

In Equation 5, $S_m(\tau)$ is the m-th partial correlation function of the 12 partial correlation functions based on the autocorrelation of the 12 partial received signals.

Figure 4:
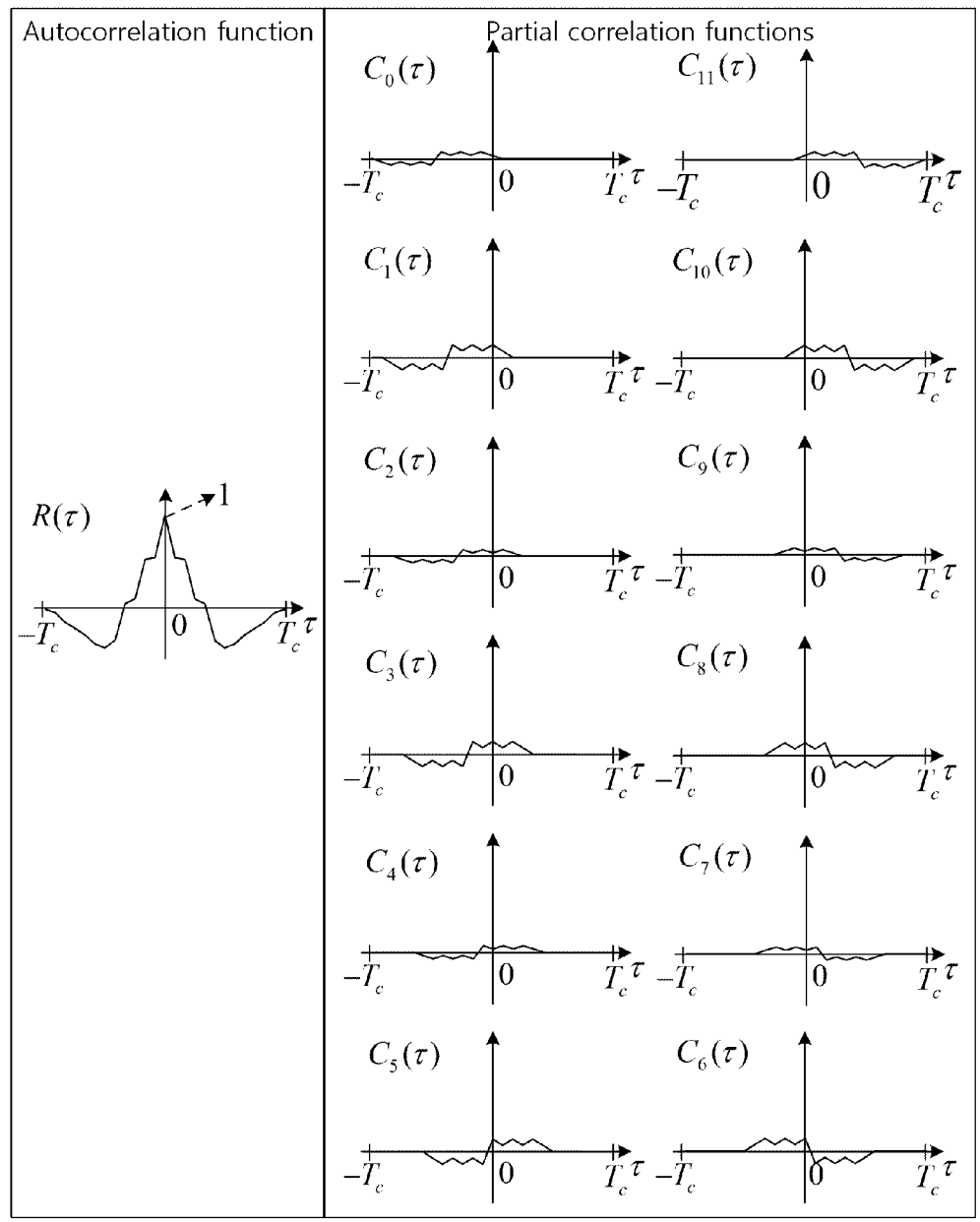
FIG. 4 illustrates the waveform of the autocorrelation function of a received CBOC(6,1,1/11,'−') signal for the apparatus for tracking a CBOC signal according to the embodiment of the present invention and the waveforms of partial correlation functions constituting the autocorrelation function.

FIG. 4 illustrates the waveform of the autocorrelation function of a received CBOC(6,1,1/11,'−') signal for the apparatus for tracking a CBOC signal according to the embodiment of the present invention and the waveforms of partial correlation functions constituting the autocorrelation function.

Referring to FIG. 4, the autocorrelation function of the CBOC(6,1,1/11,'−') signal may be represented by the sum of 12 partial correlation functions based on the autocorrelation of 12 partial received signals.

Meanwhile, throughout the specification of the present invention, for real numbers A and B, an elimination operation refers to an algebraic relation given as the following Equation 6:

$$\begin{cases} A\,!\,B = 0 \text{ if } AB \leq 0 \\ A\,!\,B > 0 \text{ if } AB > 0 \end{cases} \quad (6)$$

where $$A\,!\,B \equiv |A| + |B| - |A - B|$$

Accordingly, if an elimination operation is performed on certain two partial correlation functions, as in Equation 6, an interval in which the product of the two partial correlation functions is 0 or a negative value is eliminated because the result of the elimination operation is 0, with the result that only an interval in which the product of the two partial correlation functions is a positive value remains.

When partial correlation functions $S_m(\tau)$ and $S_{11-m}(\tau)$ (where m is an integer ranging from 0 to 11) that belong to the 12 partial correlation functions and symmetrical waveforms are compared with the autocorrelation function, $S_m(\tau) \times S_{11-m}(\tau) \leq 0$ in a range, excluding a region in which a main peak higher than 0 appears in the autocorrelation function. Accordingly, only a region in which the main peak appears in the autocorrelation function may be left and thus side peaks may be eliminated by performing an elimination operation on the partial correlation functions $S_m(\tau)$ and $S_{11-m}(\tau)$.

However, in order to surpass such the level of the elimination of side peaks and form a sharp main peak, the present invention pays attention to a sixth and seventh partial correlation function pair $S_5(\tau)$ and $S_6(\tau)$ that belongs to the partial correlation function pairs $S_m(\tau)$ and $S_{11-m}(\tau)$ and corresponds to m=5.

Figure 5:
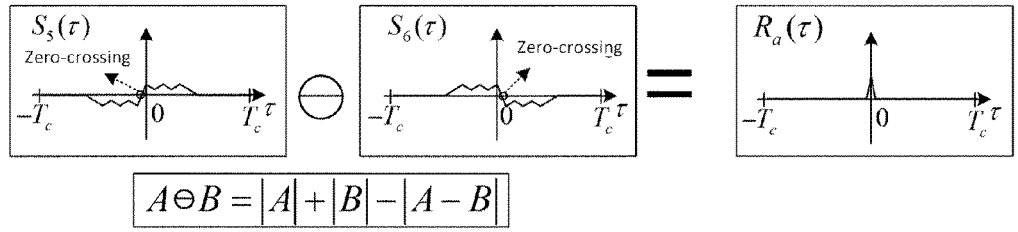
FIG. 5 illustrates a basic intermediate correlation function that is generated from the sixth and seventh partial correlation functions of partial correlation functions constituting the autocorrelation function of the received CBOC(6,1,1/11,'−') signal for the apparatus for tracking a CBOC signal according to the embodiment of the present invention.

Temporarily referring to FIG. 5 in order to describe the sixth and seventh partial correlation function pair $S_5(\tau)$ and $S_6(\tau)$, FIG. 5 illustrates a basic intermediate correlation function that is generated from the sixth and seventh partial correlation functions of partial correlation functions constituting the autocorrelation function of the CBOC(6,1,1/11,'−') signal for the apparatus for tracking a CBOC signal according to the embodiment of the present invention.

From FIG. 5, it may be observed that, with regard to the partial correlation function pair $S_5(\tau)$ and $S_6(\tau)$, a range in which $S_5(\tau) \times S_6(\tau) > 0$ corresponds to $\pm + T_c/12$, i.e., a very narrow range around an origin, and the other range has a value of 0 or a negative value. Accordingly, when an elimination operation is performed on the partial correlation function pair $S_5(\tau)$ and $S_6(\tau)$, as in the following Equation 7, the result thereof is that only a sharp peak is left in the very narrow range around an origin, which is named a "basic intermediate correlation function $R_a(\tau)$" in the present specification.

$$R_a(\tau) = S_5(\tau)\,!\,S_6(\tau) \quad (7)$$

$$= |S_5(\tau)| + |S_6(\tau)| - |S_5(\tau) - S_6(\tau)|$$

Although the width of the main peak of the basic intermediate correlation function $R_a(\tau)$ is considerably narrower than the width of the main peak of the autocorrelation function of the CBOC(6,1,1/11,'−') signal, the basic intermediate correlation function $R_a(\tau)$ is calculated using only information about the autocorrelation functions of two pulses among the 12 pulses of the BOC(6,1) signal component, and thus the height thereof is lower than that of the main peak of the autocorrelation function of the CBOC(6,1,1/11,'−') signal.

In this case, since a noise component increases also when only the height of the main peak is increased by simply scaling the basic intermediate correlation function $R_a(\tau)$, there is no advantage in the improvement of performance even when the main peak is made sharp.

Accordingly, the present invention may acquire additional intermediate correlation functions $R_m(\tau)$ in order to eliminate side peaks from the remaining partial correlation functions and maximally acquire the information a peak at the origin from each partial correlation function.

Figure 6:
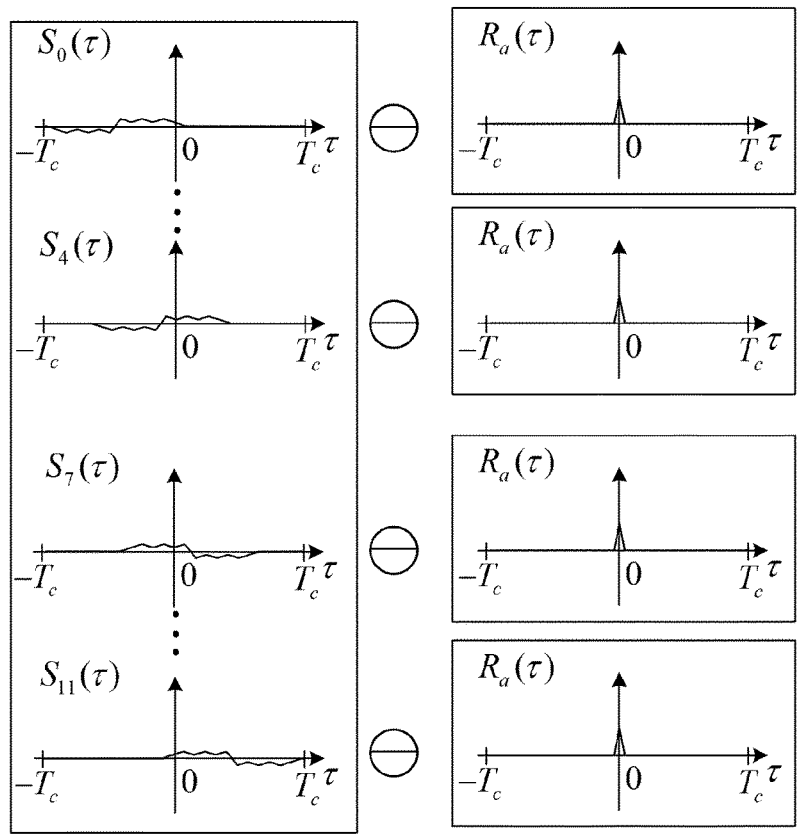
FIG. 6 illustrates a process of generating additional intermediate correlation functions by performing an elimination operation on the partial correlation functions constituting the autocorrelation function of the received CBOC(6,1,1/11,'−') signal for the apparatus for tracking a CBOC signal according to the embodiment of the present invention and the basic intermediate correlation function.

Temporarily referring to FIG. 6 in order to describe the additional intermediate correlation functions, FIG. 6 illustrates a process of generating additional intermediate correlation functions by performing an elimination operation on the partial correlation functions constituting the autocorrelation function of the CBOC(6,1,1/11,'−') signal for the apparatus for tracking a CBOC signal according to the embodiment of the present invention and the basic intermediate correlation function.

In FIG. 6, since the basic intermediate correlation function $R_a(\tau)$ has a peak having a very narrow width and an area outside the peak has a value of 0, a value obtained by multiplying the basic intermediate correlation function $R_a(\tau)$ and the partial correlation functions $S_m(\tau)$ is 0 in a range outside the peak. Accordingly, the value of the elimination operation of the basic intermediate correlation function $R_a(\tau)$ and the partial correlation functions $S_m(\tau)$ is 0 in a range outside the peak of the basic intermediate correlation function $R_a(\tau)$, and the value of the elimination operation of the basic intermediate correlation function $R_a(\tau)$ and the partial correlation functions $S_m(\tau)$ is positive in a range inside the peak of the basic intermediate correlation function $R_a(\tau)$.

Based on this observation, at least one additional intermediate correlation function $R_m(\tau)$ is generated by performing an elimination operation on at least one of the basic intermediate correlation function $R_a(\tau)$ and the partial correlation functions $S_m(\tau)$, as in the following Equation 8;

$$R_m(\tau) = R_a(\tau)\,!\,S_m(\tau) \quad (8)$$

$$= |R_a(\tau)| + |S_m(\tau)| - |R_a(\tau) - S_m(\tau)|$$

In this case, m is 0≤m≤11, or is 0≤m≤5 and 6≤m≤11, exclusive of m=5,6, in an embodiment.

Figure 7:
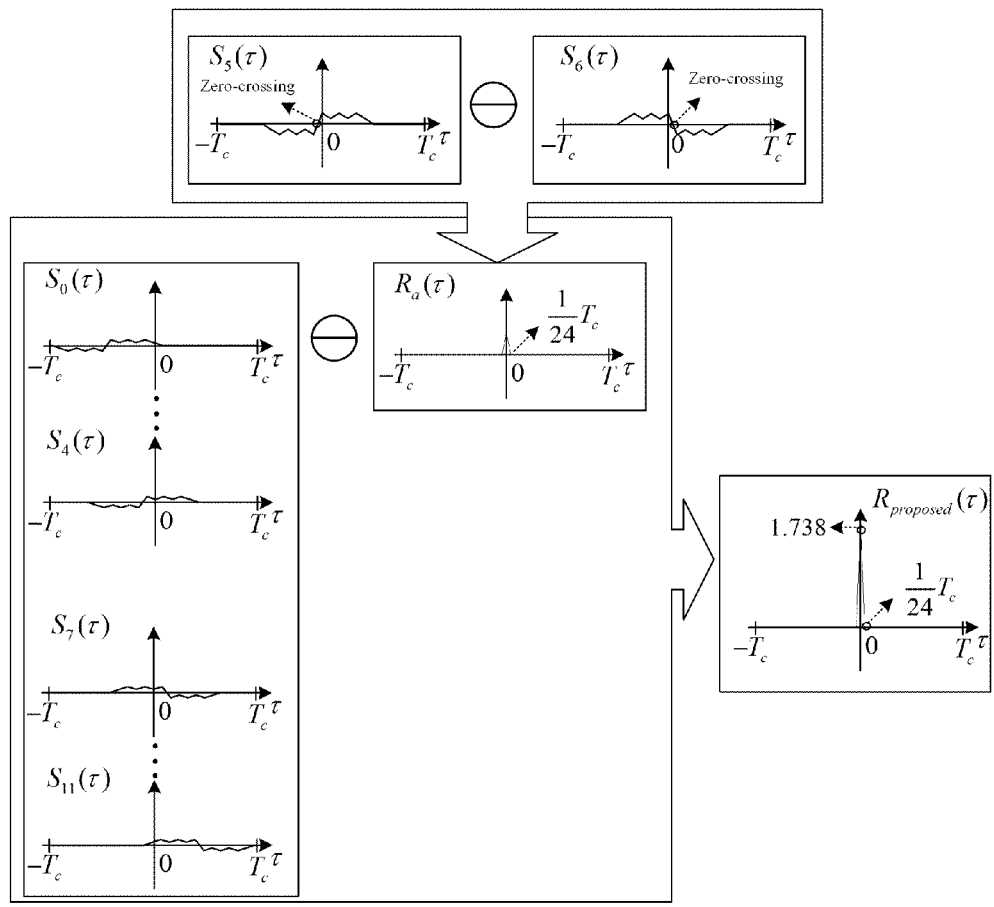
FIG. 7 illustrates a main correlation function that is generated by summing the basic intermediate correlation function and additional intermediate correlation functions of the received CBOC(6,1,1/11,'−') signal for the apparatus for tracking a CBOC signal according to the embodiment of the present invention.

Referring finally to FIG. 7 in order to describe a main correlation function $R_{proposed}(\tau)$ proposed by the present invention, FIG. 7 illustrates a main correlation function generated by summing the basic intermediate correlation function and additional intermediate correlation functions of the CBOC(6,1,1/11,'−') signal for the apparatus for tracking a CBOC signal according to the embodiment of the present invention.

In FIG. 7, the main correlation function $R_{proposed}(\tau)$ may be obtained by summing the basic intermediate correlation function $R_a(\tau)$ and the additional intermediate correlation functions $R_m(\tau)$, as in the following Equation 9 or 10:

$$R_{proposed}(\tau) = R_a(\tau) + \{R_m(\tau)\}_{m=0}^{11} \quad (9)$$
$$= R_a(\tau) + \sum_{m=0}^{11} S_m(\tau)! \, R_a(\tau)$$

$$R_{proposed}(\tau) = R_a(\tau) + \{R_m(\tau)\}_{m=0, m \neq 5,6}^{11} \quad (10)$$
$$= R_a(\tau) + \sum_{\substack{m=0 \\ m \neq 5,6}}^{11} S_m(\tau)! \, R_a(\tau)$$

In FIG. 7, the width of the base of the main peak of the main correlation function $R_{proposed}(\tau)$ is merely $T_c/12$, and the height of the main peak is 1.738 times the height of the peak of the normalized autocorrelation function in the case of Equation 10.

Figure 8:
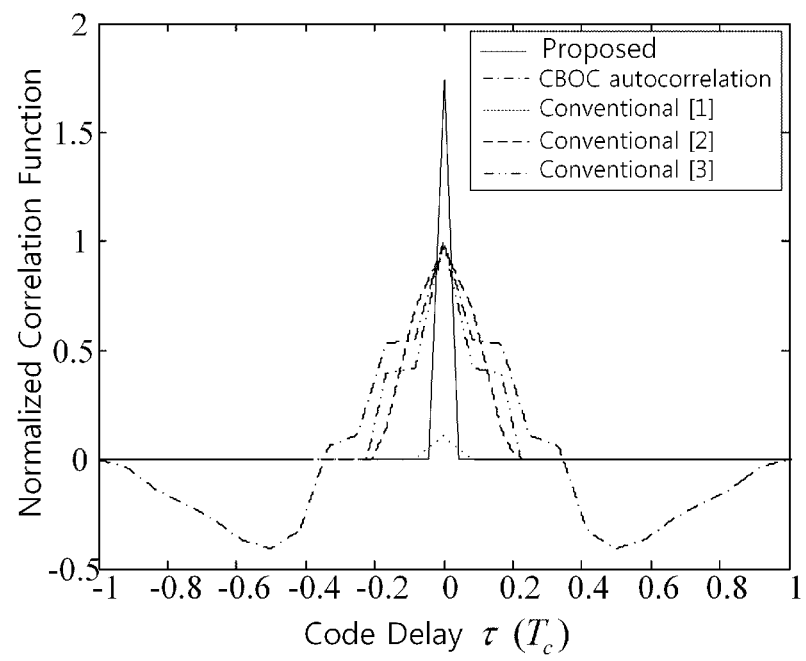
FIG. 8 is a graph comparing the main correlation function and the autocorrelation function, generated as in FIG. 7, and the correlation functions of the conventional methods with the CBOC(6,1,1/11,'−') signal for the apparatus for tracking a CBOC signal according to the embodiment of the present invention.

Meanwhile, FIG. 8 is a graph comparing the main correlation function and the autocorrelation function, generated as in FIG. 7, and the correlation functions of the conventional methods with the CBOC(6,1,1/11,'−') signal for the apparatus for tracking a CBOC signal according to the embodiment of the present invention.

Referring to FIG. 8, the main peaks of the main correlation function $R_{proposed}(\tau)$, the CBOC autocorrelation function, and the conventional invention 1, the conventional invention 2 and the conventional invention 3 introduced in the Non-Patent Document Section are compared with each other in a superposition manner.

The slope of the main peak of the main correlation function $R_{proposed}(\tau)$ is approximately 6 times the slope of the main peak of the normalized CBOC autocorrelation function, as can be seen in the following Table 1:

TABLE 1

| Correlation function | slope |
|---|---|
| proposed main correlation function | 41.713 |
| CBOC autocorrelation function | 5.393 |
| conventional invention 1 | 1.305 |
| conventional invention 2 | 3.415 |
| conventional invention 3 | 6.969 |

Accordingly, the main correlation function $R_{proposed}(\tau)$ of the present invention can provide higher positioning accuracy.

Referring back to FIG. 3, the DLL 24 using such a main correlation function is described in greater detail.

In general, the DLL 24 determines whether two correlation values based on an early delay value preceding a desired delay value and a late delay value following the desired delay value have passed the apex of a main peak while driving a loop while gradually changing the delay values based on the two correlation values to which the early delay value and the late delay value have been applied.

In greater detail, for example, when a code delay value is gradually changed from −1 chip to +1 chip, an early correlation value based on an early delayed signal having an early delay value larger than a current delay value reaches the left slope of a main peak and passes the apex of the main peak earlier than a late correlation value based a late delayed signal having a late delay value smaller than the current delay value.

If the difference between the early correlation value and the late correlation value is tracked, the difference will continue to have a positive value, will gradually decrease from the point where the early correlation value passes the apex of the main peak when the early correlation value is located on the left slope of the main peak, will become 0 when the early correlation value and the late correlation value are symmetrical with respect to the apex, and will have a negative value when the early correlation value further proceed to the right slope of the main peak.

Through this observation, it may be said that the prompt correlation value reaches the apex at a point where the difference between the early correlation value and the late correlation value passes 0, that is, a zero-crossing point.

A discrimination function capable of discriminating the state of a prompt correlation value, such as the difference between the early correlation value and the late correlation value, is generally referred to as a discriminator. Although a discrimination function for a discriminator may be devised in various manners, a discrimination function D(t), such as that of the following Equation 11, may be used:

$$D(\tau) = R_{proposed}^2\left(\tau + \frac{\Delta}{2}\right) - R_{proposed}^2\left(\tau - \frac{\Delta}{2}\right) \quad (11)$$

where Δ is the difference between the early and late delay values.

That is, if a change in a value obtained by subtracting the square of the result of the late main correlation function from the square of the result of the early main correlation function is tracked using such a discrimination function and then zero crossing is detected, it may be determined that the main correlation function has reached the apex of the main peak at the delay value.

Next, the operation of the DLL 24 is described based on the discussion so far set forth.

First, the local signal generation unit 31 generates an early and late delayed signal pair B(t+τ+Δ/2) and B(t+τ−Δ/2), respectively, based on a phase delay τ and a delay value difference Δ provided by the NCO 39, with respect to the signal pulse train of a CBOC(6,1,1/11)-modulated received signal B(t), and then provides them to the early and late mixers 32a and 32b, respectively.

The early and late mixers 32a and 32b output early and late mixed signal pairs, obtained by multiplying the received signal B(t) by the early and late delayed received signal pair B(t+τ+Δ/2) and B(t+τ−Δ/2), to the early and late correlation units 33a and 33b, respectively.

The early and late autocorrelation units 33a and 33b generate first to twelfth early partial correlation functions $\{S_m(\tau+\Delta/2)\}_{m=0}^{11}$ and first to twelfth late partial correlation functions $\{S_m(\tau-\Delta/2)\}_{m=0}^{11}$ by performing the autocorrelation operation of early and late mixing signal pairs with respect to the total time T (0≤t≤T), as in Equation 5.

Next, the early basic intermediate correlation function generation unit 34a generates an early basic intermediate correlation function $R_a(\tau+\Delta/2)$ by performing an elimination operation on sixth and seventh early partial correlation functions $S_5(\tau+\Delta/2)$ and $S_6(\tau+\Delta/2)$, as in Equation 6.

The early additional intermediate correlation function generation unit 35a may acquire first to fifth and eighth to twelfth early additional intermediate correlation functions $\{R_m(\tau+\Delta/2)\}_{m=0,m\neq 5,6}^{11}$ by performing an elimination operation on each of the remaining 10 early partial correlation functions $\{S_m(\tau+\Delta/2)\}_{m=0,m\neq 5,6}^{11}$, excluding the sixth and seventh early partial correlation functions $S_5(\tau+\Delta/2)$ and $S_6(\tau+\Delta/2)$ from the first to twelfth early partial correlation functions $\{S_m(\tau+\Delta/2)\}_{m=0}^{11}$, and the early basic intermediate correlation function $R_a(\tau+\Delta/2)$.

In an embodiment, the early additional intermediate correlation function generation unit 35a may acquire first to twelfth early additional intermediate correlation functions $\{R_m(\tau+\Delta/2)\}_{m=0}^{11}$ by performing an elimination operation on each of the first to twelfth early partial correlation functions $\{S_m(\tau+\Delta/2)=\}_{m=0}^{11}$ and the early basic intermediate correlation function $R_a(\tau+\Delta/2)$.

Similarly, the late basic intermediate correlation function generation unit 34b generates a late basic intermediate correlation function $R_a(\tau-\Delta/2)$ by performing an elimination operation on sixth and seventh late partial correlation functions $S_5(\tau-\Delta/2)$ and $S_6(\tau-\Delta/2)$, as in Equation 6.

The late additional intermediate correlation function generation unit 35b may acquire first to fifth and eighth to twelfth late additional intermediate correlation functions $\{R_m(\tau-\Delta/2)\}_{m=0,m\neq 5,6}^{11}$ by performing an elimination operation on each of the remaining ten late partial correlation functions $\{S_m(\tau-\Delta/2)\}_{m=0,m\neq 5,6}^{11}$, excluding the sixth and seventh late partial correlation functions $S_5(\tau-\Delta/2)$ and $S_6(\tau-\Delta/2)$ from the first to twelfth late partial correlation functions $\{S_m(\tau-\Delta/2)\}_{m=0}^{11}$, and the late basic intermediate correlation function $R_a(\tau-\Delta/2)$.

In an embodiment, the late additional intermediate correlation function generation unit 35b may acquire first to twelfth late additional intermediate correlation functions $\{R_m(\tau-\Delta/2)\}_{m=0}^{11}$ by performing an elimination operation on each of the first to twelfth late partial correlation functions $\{S_m(\tau-\Delta/2)\}_{m=0}^{11}$ and the late basic intermediate correlation function $R_a(\tau-\Delta/2)$.

The early combination unit 36a acquires the early main correlation function $R_{proposed}(\tau+\Delta/2)$ by simply summing the early basic intermediate correlation function $R_a(\tau+\Delta/2)$ and the first to fifth and eighth to twelfth early additional intermediate correlation functions $\{R_m(\tau+\Delta/2)\}_{m=0,m\neq 5,6}^{11}$ based on the fact that the information of the sixth and seventh partial correlation functions has been already included through the acquisition of the basic intermediate correlation function.

In an embodiment, the early combination unit 36a may acquire the early main correlation function $R_{proposed}(\tau+\Delta/2)$ by simply summing the early basic intermediate correlation function $R_m(\tau+\Delta/2)$ and the first to twelfth early additional intermediate correlation functions $\{R_m(\tau+\Delta/2)\}_{m=0}^{11}$.

Similarly, the late combination unit 36b acquires the late main correlation function $R_{proposed}(\tau-\Delta/2)$ by simply summing the late basic intermediate correlation function $R_a(\tau-\Delta/2)$ and the first to fifth and eighth to twelfth late additional intermediate correlation functions $\{R_m(\tau-\Delta/2)\}_{m=0,m\neq 5,6}^{11}$ based on the fact that the information of the sixth and seventh partial correlation functions has been already included through the acquisition of the basic intermediate correlation function.

In an embodiment, the late combination unit 36b may acquire the late main correlation function $R_{proposed}(\tau-\Delta/2)$ by simply summing the late basic intermediate correlation function $R_a(\tau-\Delta/2)$ and the first to twelfth late additional intermediate correlation functions $\{R_m(\tau-\Delta/2)\}_{m=0}^{11}$.

The main peaks of the early and late main correlation functions $R_{proposed}(\tau+\Delta/2)$ and $R_{proposed}(\tau-\Delta/2)$ have a very sharp shape that has a height of about 1.738, a base width of $(1/12)T_c$ and a slope of about 41.7.

The discriminator mixer 37 outputs an output value obtained by subtracting the square of the late main correlation function $R_{proposed}(\tau-\Delta/2)$ from the square of the early main correlation function $R_{proposed}(+\Delta/2)$ in accordance with a predetermined discrimination function, for example, Equation 11.

The loop filter 38 may filter out the noise component of the discrimination output of the discriminator mixer 37.

The NCO 39 determines the phase delay $\tau$ of the delayed signal for the received signal based on the filtered discrimination output, and outputs the determined phase delay $\tau$ to the local signal generation unit 31.

For example, the NCO 39 may increase the phase delay $\tau$ by a predetermined interval and then output the increased phase delay $\tau$ to the local signal generation unit 31, on the ground that if the discrimination output is a positive value larger than a predetermined threshold value, this means that an early correlation value is larger than a late correlation value and also means that the applied phase delay $\tau$ is smaller than a phase delay corresponding to the apex of a main peak in light of the shape of the main peak of a main correlation function.

Furthermore, if it is determined based on the filtered discrimination output that the value of the main correlation function based on the phase delay $\tau$ is located at the apex of the main peak, the NCO 39 outputs the value of the phase delay $\tau$ at the time to the local code generation unit 22 as a code delay value.

Figure 9:
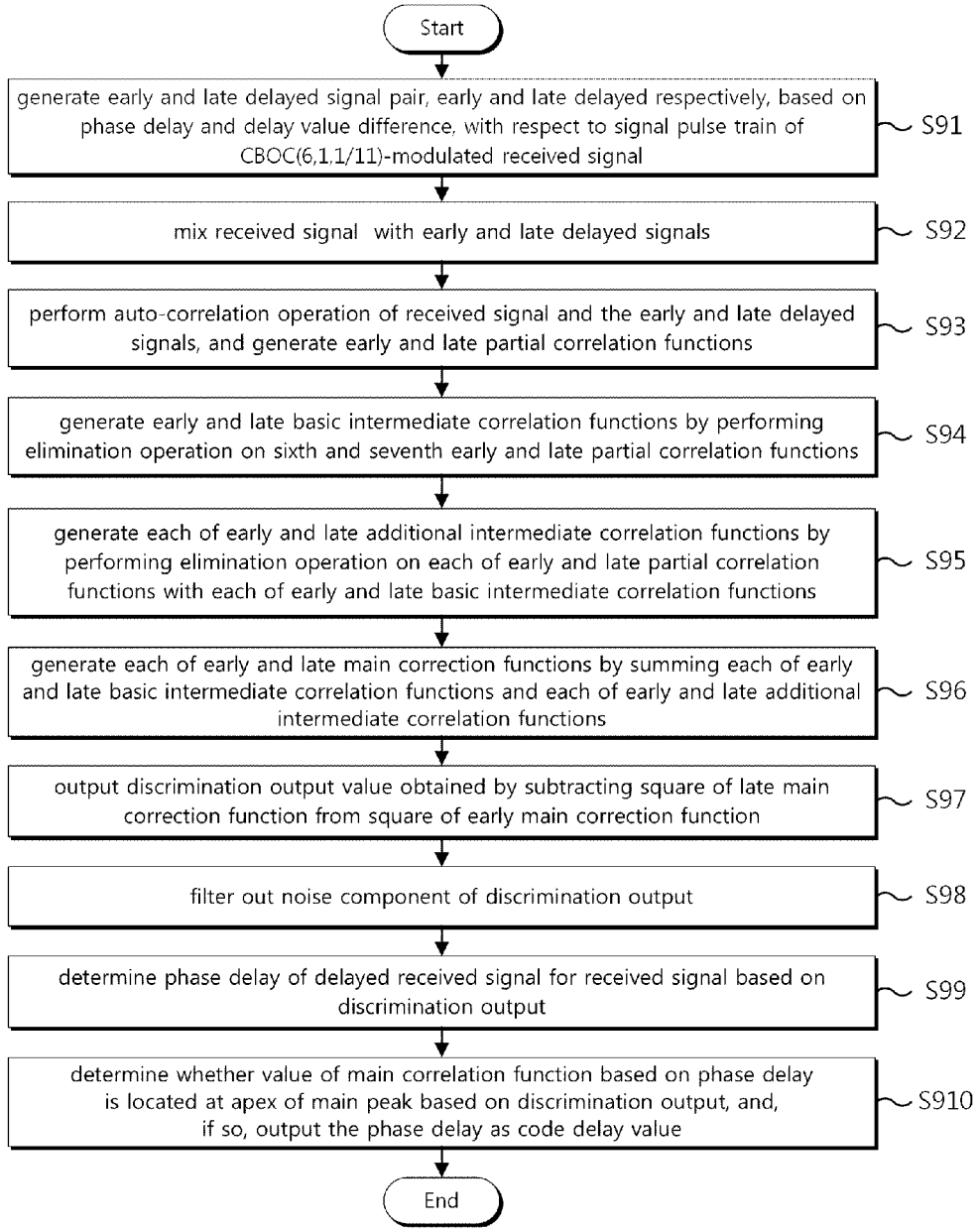
FIG. 9 is a flowchart illustrating a method of tracking a CBOC signal according to another embodiment of the present invention.

FIG. 9 is a flowchart illustrating a method of tracking a CBOC signal according to another embodiment of the present invention.

First, at step S91, an early and late delayed signal pair $B(t+\tau+\Delta/2)$ and $B(t+\tau-\Delta/2)$ early and late delayed, respectively, based on a phase delay $\tau$ and a delay value difference $\Delta$ provided by the NCO 39 with respect to the signal pulse train of a CBOC(6,1,1/11)-modulated received signal $B(t)$ is generated.

At step S92, early and late mixed signal pairs, obtained by multiplying the received signal $B(t)$ by the early and late delayed received signal pair $B(t+\tau+\Delta/2)$ and $B(t+\tau-\Delta/2)$, are output.

At step S93, first to twelfth early partial correlation functions $\{S_m(\tau+\Delta/2)\}_{m=0}^{11}$ and first to twelfth late partial correlation functions $\{S_m(\tau-\Delta/2)\}_{m=0}^{11}$ are generated by performing the autocorrelation operations of early and late mixing signal pairs with respect to the total time T ($0 \leq t \leq T$), as in Equation 5.

At step S94, an early basic intermediate correlation function $R_a(\tau+\Delta/2)$ is generated by performing an elimination operation on sixth and seventh early partial correlation functions $S_5(\tau+\Delta/2)$ and $S_6(\tau+\Delta/2)$, as in Equation 6; and a late basic intermediate correlation function $R_a(\tau-\Delta/2)$ is generated by performing an elimination operation on sixth and seventh late partial correlation functions $S_5(\tau-\Delta/2)$ and $S_6(\tau-\Delta/2)$, as in Equation 6.

At step S95, first to fifth and eighth to twelfth early additional intermediate correlation functions $\{R_m(\tau+\Delta/2)\}_{m=0,m\neq 5,6}^{11}$ are acquired by performing an elimination operation on each of the remaining 10 early partial correlation functions $\{S_m(\tau+\Delta/2)\}_{m=0,m\neq 5,6}^{11}$, excluding the sixth and seventh early partial correlation functions $S_5(\tau+\Delta/2)$ and $S_6(\tau+\Delta/2)$ from the first to twelfth early partial correlation functions $\{S_m(\tau+\Delta/2)\}_{m=0}^{11}$, and the early basic intermediate correlation function $R_a(\tau+\Delta/2)$; and first to fifth and eighth to twelfth late additional intermediate correlation functions $\{R_m(\tau-\Delta/2)\}_{m=0,m\neq 5,6}^{11}$ are acquired by performing an elimination operation on each of the remaining ten late partial correlation functions $\{S_m(\tau-\Delta/2)\}_{m=0,m\neq 5,6}^{11}$, excluding the sixth and seventh late partial correlation functions $S_5(\tau-\Delta/2)$ and $S_6(\tau-\Delta/2)$ from the first to twelfth late partial correlation functions $\{S_m(\tau-\Delta/2)\}_{m=0}^{11}$, and the late basic intermediate correlation function $R_a(\tau-\Delta/2)$.

In an embodiment, at step S95, first to twelfth early additional intermediate correlation functions $\{R_m(\tau+\Delta/2)\}_{m=0}^{11}$, are acquired by performing an elimination operation on each of the first to twelfth early partial correlation functions $\{S_m(\tau+\Delta/2)\}_{m=0}^{11}$ and the early basic intermediate correlation function $R_a(\tau+\Delta/2)$; and first to twelfth late additional intermediate correlation functions $\{R_m(\tau-\Delta/2)\}_{m=0}^{11}$ are acquired by performing an elimination operation on each of the first to twelfth late partial correlation functions $\{S_m(\tau-\Delta/2)\}_{m=0}^{11}$ and the late basic intermediate correlation function $R_a(\tau-\Delta/2)$.

At step S96, based on the fact that the information of the sixth and seventh partial correlation functions has been already included through the acquisition of the basic intermediate correlation function, the early main correlation function $R_{proposed}(\tau+\Delta/2)$ may be acquired by simply summing the early basic intermediate correlation function $R_a(\tau+\Delta/2)$ and the first to fifth and eighth to twelfth early additional intermediate correlation functions $\{R_m(\tau+\Delta/2)\}_{m=0,m\neq 5,6}^{11}$; and the late main correlation function $R_{proposed}(\tau-\Delta/2)$ may be acquired by simply summing the late basic intermediate correlation function $R_a(\tau-\Delta/2)$ and the first to fifth and eighth to twelfth late additional intermediate correlation functions $\{R_m(\tau-\Delta/2)\}_{m=0,m\neq 5,6}^{11}$.

In an embodiment, at step S96, the early main correlation function $R_{proposed}(\tau+\Delta/2)$ may be acquired by simply summing the early basic intermediate correlation function $R_a(\tau+\Delta/2)$ and the first to twelfth early additional intermediate correlation functions $\{R_m(\tau+\Delta/2)\}_{m=0}^{11}$; and the late main correlation function $R_{proposed}(\tau-\Delta/2)$ may be acquired by simply summing the late basic intermediate correlation function $R_a(\tau-\Delta/2)$ and the first to twelfth late additional intermediate correlation functions $\{R_m(\tau-\Delta/2)\}_{m=0}^{11}$.

At step S97, an output value obtained by subtracting the square of the late main correlation function $R_{proposed}(\tau-\Delta/2)$ from the square of the early main correlation function $R_{proposed}(\tau+\Delta/2)$ in accordance with a predetermined discrimination function, such as Equation 11, is output.

At step S98, the noise component of the discrimination output may be filtered out.

At step S99, the phase delay $\tau$ of the delayed signal with respect to the received signal may be determined based on the filtered discrimination output.

At step S910, if it is determined that the main correlation function value based on the phase delay $\tau$ is located at the apex of a main peak based on the filtered discrimination output, the value of the phase delay $\tau$ at the time is output as a code delay value.

Figure 10:
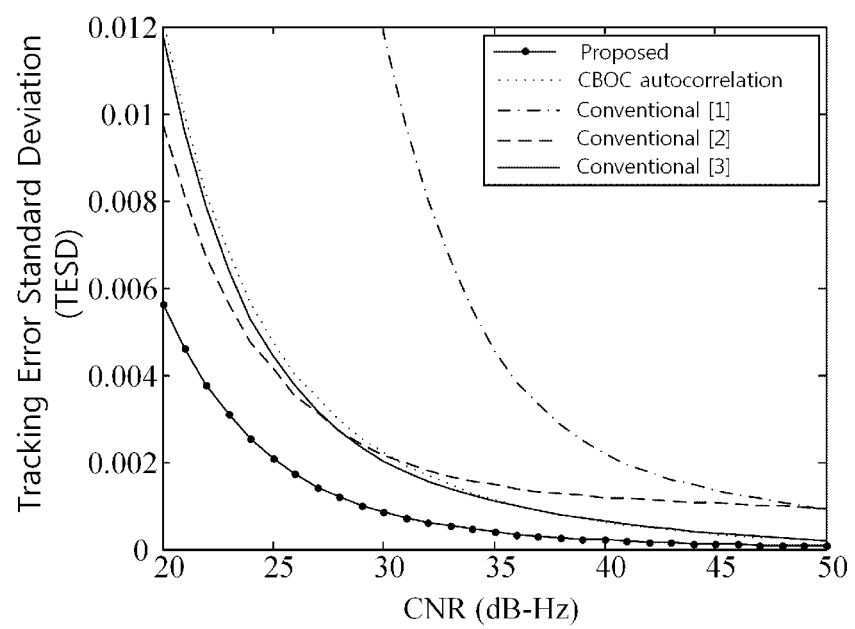
FIG. 10 is a graph illustrating the performance of the apparatus and method for tracking a CBOC signal according to the embodiments of the present invention.

FIG. 10 is a graph illustrating the performance of the apparatus and method for tracking a CBOC signal according to the embodiments of the present invention.

Performance index is tracking error standard deviation (TESD). The TESD of the autocorrelation function of a CBOC(6,1,1/11) signal and TESD using a main correlation function according to the present invention were simulated within a predetermined carrier-to-noise ratio (CNR) range.

It can be seen that, when the TESDs were observed while the CNR was being varied, the case of performing tracking using a main correlation function according to the present invention exhibited lower TESDs than the case of performing tracking using an autocorrelation function and main correlation functions according to the conventional methods at CNRs in all ranges of interest, and, in particular, exhibited excellent performance indices having a CNR gain equal to or higher than 3 dB-Hz at the same TESD value under the condition that the CNR had a low value ranging from 20 to 30 dB-Hz.

Although the difference in TESD between the autocorrelation function and other main correlation functions was reduced under the condition that the CNR had a high value ranging from 40 to 50 dB-Hz, the main correlation function of the present invention exhibited higher performance in the almost overall CNR range.

The above embodiments and the accompanying drawings are intended merely to clearly illustrate part of the technical spirit of the present invention, and it will be apparent to those skilled in the art that modifications and specific embodiments that those skilled in the art can easily derive from the present specification and the accompanying drawings are all included in the range of the rights of the present invention.

Furthermore, the apparatus according to the present invention may be implemented as computer-readable code stored on a computer-readable storage medium. The computer-readable storage medium includes all types of storage devices on which data that can be read by a computer system can be stored. Examples of the storage medium include ROM, RAM, an optical disk, magnetic tape, a floppy disk, hard disk, nonvolatile memory. Furthermore, the computer-readable medium may be distributed across a computer system connected over a network, and thus computer-readable code may be stored and executed in a distributed manner.

What is claimed is:

1. A delay lock loop (DLL), comprising:
a local signal generation circuit configured to generate an early and late delayed signal pair $B(t+\tau+\Delta/2)$ and $B(t+\tau-\Delta/2)$, respectively, based on a phase delay $\tau$ and a delay value difference $\Delta$ provided by a numerical control oscillator (NCO), with respect to a signal pulse train of a CBOC(6,1,1/11)-modulated received signal $B(t)$, wherein the CBOC is a composite binary offset carrier;
early and late autocorrelation circuits configured to generate first to twelfth early partial correlation functions $\{S_m(\tau+\Delta/2)\}_{m=0}^{11}$ of the CBOC(6,1,1/11)-modulated received signal $B(t)$ and first to twelfth late partial correlation functions $\{S_m(\tau-\Delta/2)\}_{m=0}^{11}$ of the CBOC(6,1,1/11)-modulated received signal $B(t)$ by performing an autocorrelation operation of early and late mixing signal pairs with respect to a total time T ($0 \leq t \leq T$), wherein $S_m$ is an m-th partial correlation function;
early and late basic intermediate correlation function generation circuits configured to generate an early basic intermediate correlation function $R_a(\tau+\Delta/2)$ by performing an elimination operation on sixth and seventh early partial correlation functions $S_5(\tau+\Delta/2)$ and $S_6(\tau+\Delta/2)$ of the CBOC(6,1,1/11)-modulated received signal $B(t)$, and to generate a late basic intermediate correlation function $R_a(\tau-\Delta/2)$ of the CBOC(6,1,1/11)-modulated received signal B(t) by performing an elimination operation on sixth and seventh late partial correlation functions $S_5(\tau-\Delta/2)$ and $S_6(\tau-\Delta/2)$ of the CBOC(6,1,1/11)-modulated received signal B(t), wherein $R_a$ is a basic intermediate correlation function;

an early additional intermediate correlation function generation circuit configured to acquire first to fifth and eighth to twelfth early additional intermediate correlation functions $\{R_m(\tau+\Delta/2)\}_{m=0, m\neq 5,6}^{11}$ by performing an elimination operation on each of remaining ten early partial correlation functions $\{S_m(\tau+\Delta/2)\}_{m=0, m\neq 5,6}^{11}$, excluding the sixth and seventh early partial correlation functions $S_5(\tau+\Delta/2)$ and $S_6(\tau+\Delta/2)$ from the first to twelfth early partial correlation functions $\{S_m(\tau+\Delta/2)\}_{m=0}^{11}$, and the early basic intermediate correlation function $R_a(\tau+\Delta/2)$, wherein $R_m$ is an additional intermediate correlation function;

a late additional intermediate correlation function generation circuit configured to acquire first to fifth and eighth to twelfth late additional intermediate correlation functions $\{R_m(\tau-\Delta/2)\}_{m=0, m\neq 5,6}^{11}$ by performing an elimination operation on each of remaining ten late partial correlation functions $\{S_m(\tau-\Delta/2)\}_{m=0, m\neq 5,6}^{11}$, excluding the sixth and seventh late partial correlation functions $S_5(\tau-\Delta/2)$ and $S_6(\tau-\Delta/2)$ from the first to twelfth late partial correlation functions $\{S_m(\tau-\Delta/2)\}_{m=0}^{11}$, and the late basic intermediate correlation function $R_a(\tau-\Delta/2)$;

early and late combination circuits configured to acquire an early main correlation function $R_{proposed}(\tau+\Delta/2)$ by summing the early basic intermediate correlation function $R_a(\tau+\Delta/2)$ and the first to fifth and eighth to twelfth early additional intermediate correlation functions $\{R_m(\tau+\Delta/2)\}_{m=0, m\neq 5,6}^{11}$, and to acquire a late main correlation function $R_{proposed}(\tau-\Delta/2)$ by summing the late basic intermediate correlation function $R_a(\tau-\Delta/2)$ and the first to fifth and eighth to twelfth late additional intermediate correlation functions $\{R_m(\tau-\Delta/2)\}_{m=0, m\neq 5,6}^{11}$; and the NCO configured to determine the phase delay $\tau$ for the CBOC(6,1,1/11)-modulated received signal B(t) based on discrimination output of a discrimination function based on values of the early and late main correlation functions, and to output the determined phase delay $\tau$ to the local signal generation circuit;

wherein the elimination operation performed on the sixth and seventh early partial correlation functions $S_5(\tau+\Delta/2)$ and $S_6(\tau+\Delta/2)$, the elimination operation performed on the sixth and the seventh late partial correlation functions $S_5(\tau-\Delta/2)$ and $S_6(\tau-\Delta/2)$, the elimination operation performed on each of the remaining ten early partial correlation functions $\{S_m(\tau+\Delta/2)\}_{m=0, m\neq 5,6}^{11}$, and the elimination operation performed on each of the remaining ten late partial correlation functions $\{S_m(\tau-\Delta/2)\}_{m=0, m\neq 5,6}^{11}$, each satisfy a condition $|A|+|B|-|A-B|$, wherein A and B are real numbers.

2. The DLL of claim 1, wherein the first to twelfth early partial correlation functions $\{S_m(\tau+\Delta/2)\}_{m=0}^{11}$ and the first to twelfth late partial correlation functions $\{S_m(\tau-\Delta/2)\}_{m=0}^{11}$ are acquired as results of autocorrelation operations based on partial received signals including pulses at respective pulse locations of the CBOC(6,1,1/11)-modulated received signal B(t) in accordance with the following equation:

$$R(\tau) = \sum_{m=0}^{11} \left\{ \sum_{i=-\infty}^{\infty} \frac{\sqrt{P}}{PT} \int_0^T B(t) h_i r_{T_C}(t+\tau-iT_c) s_m(t+\tau) dt \right\}$$

$$= \sum_{m=0}^{11} \left\{ \sum_{i=0}^{T/T_c-1} \frac{1}{PT} \int_{(12j+m)T_s}^{(12j+m+1)T_s} B(t) B(t+\tau) dt \right\}$$

$$= \sum_{m=0}^{11} S_m(\tau),$$

where P is power of the CBOC(6,1,1/11)-modulated received signal B(t), T is a period of a pseudo noise code, $h_i \in \{-1, 1\}$ is an i-th chip of a pseudo random noise (PRN) code comprising a period T, $T_c$ is a period of a PRN code chip, $r_{T_c}(t)$ is a circuit square wave present in $[0, T_c]$, d(t) is navigation data, and $s_m(t)$ is a pulse at an m-th ($0 \leq m \leq 11$) pulse location among 12 pulses present in each chip period $T_c$.

3. The DLL of claim 1, wherein the early basic intermediate correlation function $R_a(\tau+\Delta/2)$ and the late basic intermediate correlation function $R_a(\tau-\Delta/2)$ are generated based on the following equation:

$$R_a(\tau) = S_5(\tau) \,!\, S_6(\tau)$$

$$= |S_5(\tau)| + |S_6(\tau)| - |S_5(\tau) - S_6(\tau)|.$$

4. The DLL of claim 3, wherein the early additional intermediate correlation functions $R_m(\tau+\Delta/2)$ and the late additional intermediate correlation functions $R_m(\tau-\Delta/2)$ are generated based on the following equation:

$$R_m(\tau) = R_a(\tau) \,!\, S_m(\tau)$$

$$= |R_a(\tau)| + |S_m(\tau)| - |R_a(\tau) - S_m(\tau)|.$$

5. The DLL of claim 1, wherein:
the early additional intermediate correlation function generation circuit is further configured to acquire first to twelfth early additional intermediate correlation functions $\{R_m(\tau+\Delta/2)\}_{m=0}^{11}$ by performing an elimination operation on each of the first to twelfth early partial correlation functions $\{S_m(\tau+\Delta/2)\}_{m=0}^{11}$ and the early basic intermediate correlation function $R_a(\tau+\Delta/2)$; and
the late additional intermediate correlation function generation circuit is further configured to acquire first to twelfth late additional intermediate correlation functions $\{R_m(\tau-\Delta/2)\}_{m=0}^{11}$ by performing an elimination operation on each of the first to twelfth late partial correlation functions $\{S_m(\tau-\Delta/2)\}_{m=0}^{11}$ and the late basic intermediate correlation function $R_a(\tau-\Delta/2)$.

6. The DLL of claim 5, wherein:
the early combination circuit is further configured to acquire the early main correlation function $R_{proposed}(\tau+\Delta/2)$ by summing the early basic intermediate correlation function $R_a(\tau+\Delta/2)$ and the first to twelfth early additional intermediate correlation functions $\{R_m(\tau+\Delta/2)\}_{m=0}^{11}$; and
the late combination circuit is further configured to acquire the late main correlation function $R_{proposed}(\tau-\Delta/2)$ by summing the late basic intermediate correlation function $R_a(\tau-\Delta/2)$ and the first to twelfth late additional intermediate correlation functions $\{R_m(\tau-\Delta/2)\}_{m=0}^{11}$.

7. A method of tracking a CBOC(6,1,1/11)-modulated received signal B(t), comprising:
generating an early and late delayed signal pair $B(t+\tau+\Delta/2)$ and $B(t+\tau-\Delta/2)$, respectively, based on a phase delay $\tau$ and a delay value difference $\Delta$ provided by a numerical control oscillator (NCO), with respect to a signal pulse train of the CBOC(6,1,1/11)-modulated received signal B(t), wherein the CBOC is a composite binary offset carrier;
generating first to twelfth early partial correlation functions $\{S_m(\tau+\Delta/2)\}_{m=0}^{11}$ of the CBOC(6,1,1/11)-modulated received signal B(t) and first to twelfth late partial correlation functions $\{S_m(\tau-\Delta/2)\}_{m=0}^{11}$ of the CBOC (6,1,1/11)-modulated received signal B(t) by performing an autocorrelation operation of early and late mixing signal pairs with respect to a total time T ($0 \leq t \leq T$), wherein $S_m$ is an m-th partial correlation function;
generating an early basic intermediate correlation function $R_a(\tau+\Delta/2)$ by performing an elimination operation on sixth and seventh early partial correlation functions $S_5(\tau+\Delta/2)$ and $S_6(\tau+\Delta/2)$ of the CBOC(6,1,1/11)-modulated received signal B(t), and generating a late basic intermediate correlation function $R_a(\tau-\Delta/2)$ of the CBOC(6,1,1/11)-modulated received signal B(t) by performing an elimination operation on sixth and seventh late partial correlation functions $S_5(\tau-\Delta/2)$ and $S_6(\tau-\Delta/2)$ of the CBOC(6,1,1/11)-modulated received signal B(t), wherein $R_a$ is a basic intermediate correlation function;
acquiring first to fifth and eighth to twelfth early additional intermediate correlation functions $\{R_m(\tau+\Delta/2)\}_{m=0, m \neq 5,6}^{11}$ by performing an elimination operation on each of remaining ten early partial correlation functions $\{S_m(\tau+\Delta/2)\}_{m=0, m \neq 5,6}^{11}$, excluding the sixth and seventh early partial correlation functions $S_5(\tau+\Delta/2)$ and $S_6(\tau+\Delta/2)$ from the first to twelfth early partial correlation functions $\{S_m(\tau+\Delta/2)\}_{m=0}^{11}$, and the early basic intermediate correlation function $R_a(\tau+\Delta/2)$, wherein $R_m$ is an additional intermediate correlation function;
acquiring first to fifth and eighth to twelfth late additional intermediate correlation functions $\{R_m(\tau-\Delta/2)\}_{m=0, m \neq 5,6}^{11}$ by performing an elimination operation on each of the remaining ten late partial correlation functions $\{S_m(\tau-\Delta/2)\}_{m=0, m \neq 5,6}^{11}$, excluding the sixth and seventh late partial correlation functions $S_5(\tau-\Delta/2)$ and $S_6(\tau-\Delta/2)$ from the first to twelfth late partial correlation functions $\{S_m(\tau-\Delta/2)\}_{m=0}^{11}$, and the late basic intermediate correlation function $R_a(\tau-\Delta/2)$;
acquiring an early main correlation function $R_{proposed}(\tau+\Delta/2)$ by summing the early basic intermediate correlation function $R_a(\tau+\Delta/2)$ and the first to fifth and eighth to twelfth early additional intermediate correlation functions $\{R_m(\tau+\Delta/2)\}_{m=0, m \neq 5,6}^{11}$, and acquiring a late main correlation function $R_{proposed}(\tau-\Delta/2)$ by simply summing the late basic intermediate correlation function $R_a(\tau-\Delta/2)$ and the first to fifth and eighth to twelfth late additional intermediate correlation functions $\{R_m(\tau-\Delta/2)\}_{m=0, m \neq 5,6}^{11}$; and
determining the phase delay $\tau$ for the CBOC(6,1,1/11)-modulated received signal B(t) based on discrimination output of a discrimination function based on values of the early and late main correlation functions, and outputting the determined phase delay $\tau$,
wherein the elimination operation performed on the sixth and seventh early partial correlation functions $S_5(\tau+\Delta/2)$ and $S_6(\tau+\Delta/2)$, the elimination operation performed on the sixth and seventh late partial correlation functions $S_5(\tau-\Delta/2)$ and $S_6(\tau-\Delta/2)$, the elimination operation performed on each of the remaining ten early partial correlation functions $\{S_m(\tau+\Delta/2)\}_{m=0, m \neq 5,6}^{11}$, and the elimination operation performed on each of the remaining ten late partial correlation functions $\{S_m(\tau-\Delta/2)\}_{m=0, m \neq 5,6}^{11}$, each satisfy a condition $|A|+|B|-|A-B|$ wherein A and B are real numbers.

8. A method of generating a CBOC(6,1,1/11) signal correlation function signal, comprising:
generating a delayed signal $B(t+\tau)$ delayed based on a phase delay $\tau$, with respect to a signal pulse train of a CBOC(6,1,1/11)-modulated received signal B(t), wherein the CBOC is a composite binary offset carrier;
generating first to twelfth partial correlation functions $\{S_m(\tau)\}_{m=0}^{11}$ by performing an autocorrelation operation of the CBOC(6,1,1/11)-modulated received signal B(t) and the delayed signal $B(t+\tau)$ with respect to a total time T ($0 \leq t \leq T$), wherein $S_m$ is an m-th partial correlation function;
generating a basic intermediate correlation function $R_a(\tau)$ by performing an elimination operation on sixth and seventh partial correlation functions $S_5(\tau)$ and $S_6(\tau)$;
acquiring first to fifth and eighth to twelfth additional intermediate correlation functions $\{R_m(\tau)\}_{m=0, m \neq 5,6}^{11}$ by performing an elimination operation on each of partial correlation functions $\{S_m(\tau)\}_{m=0, m \neq 5,6}^{11}$, excluding the sixth and seventh partial correlation functions $S_5(\tau)$ and $S_6(\tau)$ from the first to twelfth partial correlation functions $\{S_m(\tau)\}_{m=0}^{11}$, and the basic intermediate correlation function $R_a(\tau)$; and
acquiring a main correlation function $R_{proposed}(\tau)$ by summing the basic intermediate correlation function $R_a(\tau)$ and the first to fifth and eighth to twelfth additional intermediate correlation functions $\{R_m(\tau)\}_{m=0, m \neq 5,6}^{11}$, wherein $R_m$ is an additional intermediate correlation function, and
wherein the elimination operation performed on the sixth and seventh partial correlation functions $S_5(\tau)$ and $S_6(\tau)$, and the elimination operation performed on each of the partial correlation functions $\{S_m(\tau)\}_{m=0, m \neq 5,6}^{11}$ excluding the sixth and seventh partial correlation functions $S_5(\tau)$ and $S_6(\tau)$ from the first to twelfth partial correlation functions $\{S_m(\tau)\}_{m=0}^{11}$, both satisfy a condition $|A|+|B|-|A-B|$, wherein A and B are real numbers.

9. An apparatus to track a CBOC(6,1,1/11)-modulated received signal, comprising:
a frequency offset compensation circuit configured to output a compensated received signal compensated for frequency offset of a carrier frequency based on a carrier frequency compensation value with respect to the CBOC(6,1,1/11)-modulated received signal, wherein the CBOC is a composite binary offset carrier;
a local code generation circuit configured to generate a delay-compensated local code based on a code delay value;
a mixer configured to mix the delay-compensated local code with the compensated received signal;
a delay lock loop (DLL) configured to repeatedly track and calculate the code delay value, which allows a correlation value obtained by correlating the delay-compensated local code and the compensated received signal with each other, and which is located at an apex of a main peak of a correlation function, and to provide the calculated code delay value to the local code generation circuit;

a phase lock loop (PLL) configured to repeatedly calculate the carrier frequency compensation value based on an autocorrelation value of a local code, based on the tracked code delay value, to enable a phase error of a carrier signal to be minimized, and to provide the carrier frequency compensation value to the frequency offset compensation circuit; and a data extraction circuit configured to extract spreading data from a mixture of the delay-compensated local code and the compensated received signal;

wherein the DLL is configured to acquire first to fifth and eighth to twelfth additional intermediate correlation functions by performing an elimination operation on a basic intermediate correlation function, generated by performing an elimination operation on sixth and seventh partial correlation functions among first to twelfth partial correlation functions constituting an autocorrelation function of the CBOC(6,1,1/11)-modulated received signal, and each of the first to fifth and eighth to twelfth partial correlation functions, exclusive of the sixth and seventh partial correlation functions, and acquire a main correlation function having a main peak by superposing the basic intermediate correlation function and the first to fifth and eighth to twelfth additional intermediate correlation functions on each other, and wherein the elimination operation performed on the basic intermediate correlation function, and the elimination operation performed on the sixth and seventh partial correlation functions among first to twelfth partial correlation functions, each satisfy a condition $|A|+|B|-|A-B|$, wherein A and B are real numbers.

10. The apparatus of claim 9, wherein the DLL is further configured to:

acquire first to twelfth additional intermediate correlation functions by performing an elimination operation on the basic intermediate correlation function, generated by performing an elimination operation on sixth and seventh partial correlation functions among the first to twelfth partial correlation functions constituting the autocorrelation function of the CBOC(6,1,1/11)-modulated received signal, and each of the first to twelfth partial correlation functions; and acquire the main correlation function comprising the main peak by superposing the basic intermediate correlation function and the first to twelfth additional intermediate correlation functions on each other.

11. The apparatus of claim 9, wherein the data extraction circuit is further configured to extract satellite navigation data and estimate a pseudorange based on the extracted navigation data.

12. A satellite navigation signal receiver apparatus, comprising:

a front end circuit configured to output a received signal B(t) obtained by CBOC(6,1,1/11)-modulating a signal in space (SIS) received from an antenna, wherein the CBOC is a composite binary offset carrier;

a baseband processing circuit configured to acquire and track a code delay value with respect to the output received signal B(t) using a delay lock loop (DLL), to compensate for carrier frequency offset using a phase lock loop (PLL), and to extract contained data from a code delay-compensated local code and a frequency offset-compensated compensated received signal; and a navigation function processing circuit configured to perform an application function based on the extracted contained data;

wherein the baseband processing circuit operates is configured to generate a delayed signal $B(t+\tau)$, delayed based on a phase delay $\tau$, with respect to a signal pulse train of the received signal B(t), generate first to twelfth partial correlation functions $\{S_m(\tau)\}_{m=0}^{11}$ by performing an autocorrelation operation of the received signal B(t) and the delayed signal $B(t+\tau)$ with respect to a total time T ($0 \le t \le T$), wherein $S_m$ is an m-th partial correlation function, generate a basic intermediate correlation function $R_a(\tau)$ by performing an elimination operation on sixth and seventh partial correlation functions $S_5(\tau)$ and $S_6(\tau)$, acquire first to fifth and eighth to twelfth additional intermediate correlation functions $\{R_m(\tau)\}_{m=0, m \ne 5,6}^{11}$ by performing an elimination operation on each of partial correlation functions $\{S_m(\tau)\}_{m=0, m \ne 5,6}^{11}$, excluding the sixth and seventh partial correlation functions $S_5(\tau)$ and $S_6(\tau)$ from the first to twelfth partial correlation functions $\{S_m(\tau)\}_{m=0}^{11}$, and the basic intermediate correlation function $R_a(\tau)$, wherein $R_m$ is an additional intermediate correlation function, acquire a main correlation function $R_{proposed}(\tau)$ by summing the basic intermediate correlation function $R_a(\tau)$ and the first to fifth and eighth to twelfth additional intermediate correlation functions $\{R_m(\tau)\}_{m=0, m \ne 5,6}^{11}$, and output a value of the phase delay $\tau$ as the code delay value, in response to determining, based on a filtered discrimination output that a value of the main correlation function $R_{proposed}(\tau)$ based on the phase delay $\tau$ is located at an apex of a main peak, and wherein the elimination operation performed on the sixth and seventh partial correlation functions $S_5(\tau)$ and $S_6(\tau)$, and the elimination operation performed on each of the partial correlation functions $\{S_m(\tau)\}_{m=0, m \ne 5,6}^{11}$, excluding the sixth and seventh partial correlation functions $S_5(\tau)$ and $S_6(\tau)$ from the first to twelfth partial correlation functions $\{S_m(\tau)\}_{m=0}^{11}$, each satisfy a condition $|A|+|B|-|A-B|$, wherein A and B are real numbers.

* * * * *